US012785733B2

(12) United States Patent
Iyer et al.

(10) Patent No.: US 12,785,733 B2
(45) Date of Patent: Nov. 3, 2026

(54) DAC DRIVER WITH OUTPUT-BASED CALIBRATION

(71) Applicant: Avago Technologies International Sales Pte. Limited, Singapore (SG)

(72) Inventors: Arvindh Iyer, Foothill Ranch, CA (US); Anand Jitendra Vasani, Irvine, CA (US); Nitin Nidhi, San Diego, CA (US); Yuanfang Li, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 99 days.

(21) Appl. No.: 18/890,693

(22) Filed: Sep. 19, 2024

(65) Prior Publication Data

US 2025/0392332 A1 Dec. 25, 2025

Related U.S. Application Data

(60) Provisional application No. 63/662,999, filed on Jun. 21, 2024.

(51) Int. Cl.
*H04B 1/04* (2006.01)
*H03M 1/10* (2006.01)
*H04B 17/11* (2015.01)

(52) U.S. Cl.
CPC ............ *H04B 1/04* (2013.01); *H03M 1/1014* (2013.01); *H04B 17/11* (2015.01)

(58) Field of Classification Search
CPC ........................................................ H04B 1/04
USPC .......................................................... 375/295
See application file for complete search history.

(56) References Cited

U.S. PATENT DOCUMENTS 5,838,149 A * 11/1998 Perraud ................. H04M 19/08 327/55
7,276,976 B2 10/2007 Oh et al.
10,778,207 B1 9/2020 Nuttgens
11,581,875 B1 * 2/2023 Mai ................ H03K 19/018507
2011/0012769 A1 * 1/2011 Ikoma ................ H03K 17/6871 327/427
2021/0265988 A1 * 8/2021 Chen ....................... H03K 19/20
2022/0069545 A1 * 3/2022 Venkataraman ...... H01S 5/0428

OTHER PUBLICATIONS

Farzan, K. et al. "A CMOS 10-Gb/s Power-Efficient 4-PAM Transmitter", IEEE Journal of Solid-State Circuits, vol. 39, No. 3, Mar. 2004, pp. 529-532.

(Continued)

*Primary Examiner* — Lihong Yu
(74) *Attorney, Agent, or Firm* — Kim & Stewart LLP

(57) ABSTRACT

An example transmitter includes: an output comprising a first terminal and a second terminal; a driver having first transistor switches coupled to first current sources; a first circuit having a first transistor coupled between the first transistor switches and the first terminal, and a second transistor coupled between the first transistor switches and the second terminal; and a second circuit, coupled between the output and gates of the first and second transistors, configured to bias the first transistor with a first fraction of a first voltage signal at the first terminal and bias the second transistor with a first fraction of a second voltage signal at the second terminal.

20 Claims, 11 Drawing Sheets

(56) References Cited

OTHER PUBLICATIONS

Sepehrian, H. et al. "106 Gb/s PAM-4 Transmitter With 2.1 V ppd Swing in 7nm FinFET Process", 2021 Symposium on VLSI Circuits, JSAP, Jun. 13, 2021, pp. 1-2.

Extended European Search Report mailed Oct. 28, 2025 in European Patent Application No. 25183360.4, 18 pages.

* cited by examiner

DAC DRIVER WITH OUTPUT-BASED CALIBRATION

CROSS-REFERENCE TO RELATED APPLICATIONS

This application claims the benefit of U.S. provisional patent application Ser. No. 63/662,999, filed Jun. 21, 2024, which is incorporated by reference herein in its entirety.

BACKGROUND

A serializer/deserializer (SerDes) is a circuit that can be used in high-speed communications to compensate for the limitations of various mediums for data transmission. A pair of SerDes circuits can convert between serial and parallel interfaces in each direction. A serial interface may send data, referred to as serial data, sequentially over a single channel. A parallel interface may send data, referred to as parallel data, concurrently over multiple channels. Serial data can be transmitted between SerDes circuits over a transmission line. A transmission line may be a structure designed to carry electromagnetic waves. The term applies when the structure is long enough that the wave nature of the transmission must be considered. In example SerDes applications, the transmission line can be electrical, optical, or a combination of electrical and optical.

For example, a transmitter of a SerDes circuit can be coupled to a laser by an electrical transmission line and the laser can be coupled to an optical transmission line. An electrical transmission line may be a transmission line that carries electrical energy. An optical transmission line may be a transmission line that carries light energy. The transmitter can include a driver circuit ("driver") to supply an electrical signal to the laser. The driver modulates the electrical signal with data to be transmitted. The laser converts the modulated electrical signal into a modulated light signal.

In one implementation, the driver can be coupled to the laser through an amplifier (referred to as an indirect-drive implementation). The amplifier allows the driver to be independent of the laser specifications (e.g., current, voltage, and light output specifications). In another implementation, the driver can be directly coupled to the laser without an amplifier (referred to as a direct-drive implementation). In the direct-drive implementation, the driver output supports the laser voltage swing, which may be higher than the voltage swing at the output of a driver that drives an amplifier. The higher voltage swing in the direct-drive implementation can lead to reliability challenges for the driver as compared to the indirect-drive implementation. The reliability challenges include, for example, reduced lifetime and increased failure rate of devices in the driver. Accordingly, high-performance and reliable drivers are desirable for transmitters, including transmitters in applications that directly drive loads with high voltage swing.

SUMMARY

In an embodiment, a transmitter is described. The transmitter may include an output comprising a first terminal and a second terminal, and a driver having first transistor switches coupled to first current sources. The transmitter may include a first circuit having a first transistor coupled between the first transistor switches and the first terminal, and a second transistor coupled between the first transistor switches and the second terminal. The transmitter may include a second circuit, coupled between the output and gates of the first and second transistors, configured to bias the first transistor with a first fraction of a first voltage signal at the first terminal and bias the second transistor with a first fraction of a second voltage signal at the second terminal.

In an embodiment, an apparatus is described. The apparatus may include a load circuit coupled to a first node and a second node, and a driver having a digital-to-analog converter (DAC) coupled to the load circuit. The apparatus may include a first circuit having a first transistor coupled between slices of the DAC and the first node, and a second transistor coupled between the slices and the second node. The apparatus may include a second circuit, coupled to the first and second nodes and gates of the first and second transistors, configured to bias the first transistor with a first fraction of a first voltage signal from the first node and bias the second transistor with a first fraction of a second voltage signal from the second node.

In an embodiment, a method of transmitting a signal to a load circuit is described. The method may include supplying a data signal to an input of a digital-to-analog converter (DAC) of a driver in a transmitter, the transmitter including an output having a first terminal and a second terminal each coupled to the load circuit. The method may include sending, via the data signal, codes to the DAC to control transistor switches coupled to current sources. First outputs of the transistor switches can be coupled to the first terminal through a first transistor, and second outputs of transistor switches can coupled to the second terminal through a second transistor. The method may include biasing a gate of the first transistor with a fraction of a first voltage signal at the first terminal and biasing a gate of the second transistor with a fraction of a second voltage signal at the second terminal.

DETAILED DESCRIPTION

Embodiments of a current-mode digital-to-analog (DAC) driver are described. In some embodiments, the driver may include cascode transistors at the output that are shared by the transistors of the DAC switches. This can improve reliability of the cascode transistors and the switch transistors. In some embodiments, the cascode transistors may be core transistors for the technology node of the integrated circuit (IC). This can improve driver bandwidth compared to use of input/output (IO) transistors. In some embodiments, adaptive cascode biasing may feed a fraction of the voltage signal at the driver output to the cascode transistor gates. This can allow the gates of the cascode transistors to track the output voltage, which can reduce large drain-to-source and gate-to-drain voltage excursions and distribute such excursions between the cascode transistors and the switch transistors. The adaptive biasing can also increase dynamic linear range of the cascode transistors. Further, cascode gate decoupling capacitors can be provided to trade off between cascode and switch reliability. Adaptive biasing can improve the data eye height, data eye width, and data eye linearity. In some embodiments, the attenuated voltage signal at the cascode transistor gates can be used as input to a calibration circuit for calibrating the transmitter. This can minimize parasitic loading of the driver by the calibration circuit and can ensure low voltage swing at the input of the calibration circuit for reliable operation. These and other aspects of various embodiments are described below with respect to the drawings.

Figure 1:
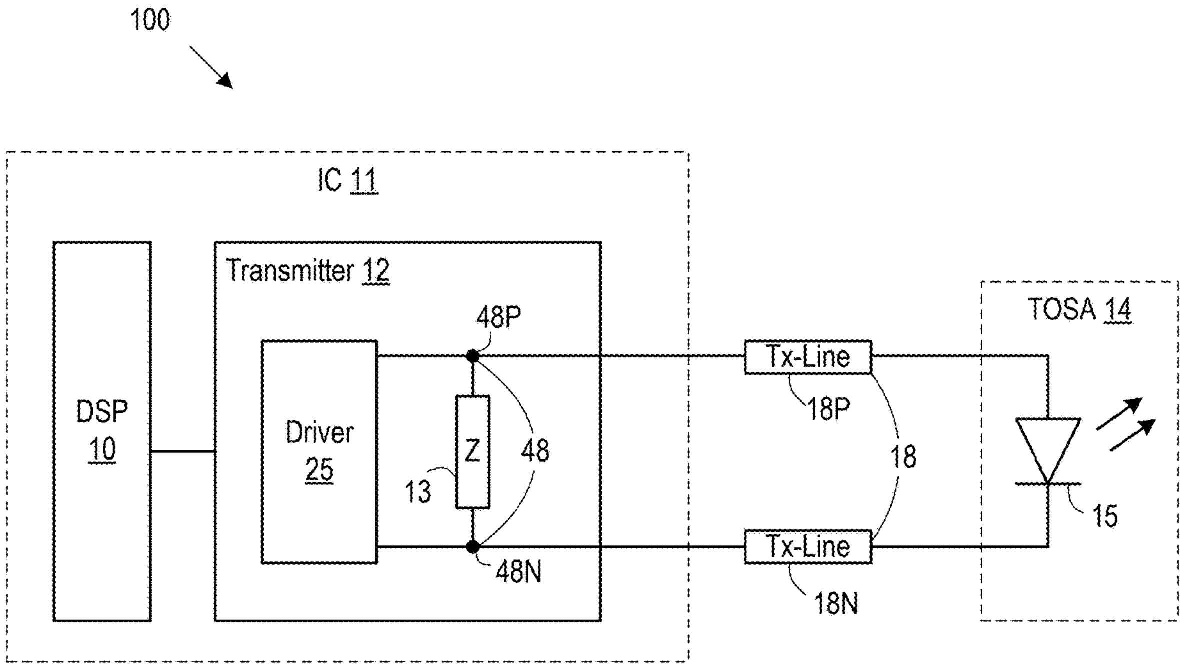
FIG. 1 is a block diagram depicting a communication circuit according to some embodiments.

FIG. 1 is a block diagram depicting a communication circuit 100 according to some embodiments. Communication circuit 100 may include an integrated circuit (IC) 11 coupled to a transmitter optical sub-assembly (TOSA) 14 by a transmission line 18. An IC may be a circuit etched onto a semiconductor material and conductive interconnect disposed on the semiconductor material. Conductive interconnect can be structures that form or electrically connect circuit elements. Various semiconductor materials and semiconductor fabrication processes are known for fabricating an IC. One skilled in the art can select among one or more such materials and processes based on the description of the examples and embodiments herein. The complementary metal-oxide-semiconductor (CMOS) fabrication process for forming integrated circuits on silicon is widely used and well-known. Accordingly, for purposes of clarity, various examples and embodiments are described below within the context of an IC formed using a CMOS fabrication process. A TOSA may be a circuit that converts an electrical signal into a light signal. In the embodiment, transmission line 18 may be an electrical transmission line. IC 11 can supply an electrical signal on transmission line 18 to TOSA 14, which converts the electrical signal into a light signal. TOSA 14 can couple the light signal to an optical transmission line (not shown).

IC 11 can include a digital signal processor (DSP) 10 coupled to a transmitter 12. In another embodiment, DSP 10 can be implemented on a separate IC coupled to IC 11. A DSP may be a circuit that manipulates data that is discrete in time and amplitude (e.g., values represented by binary codes). A transmitter may be a circuit that transmits a message (referred to herein as data) through a transmission medium. A transmitter can be coupled to a receiver via the transmission medium. Transmitter 12 can transmit data, generated by DSP 10, to TOSA 14 via an electrical signal on transmission line 18 (referred to as the transmitted signal). In this arrangement, TOSA 14 can be considered as the receiver. In some embodiments, TOSA 14 can include a directly modulated laser (DML). In a DML application, a laser diode 15 can be coupled to transmission line 18. A laser diode may be a semiconductor device that emits coherent light in response to an electrical current. Laser diode 15 can convert the transmitted signal into a light signal. In other embodiments, TOSA 14 can include an electro-adsorption-modulated laser (EML). In an EML application, a laser diode can output light and a modulator can modulate the light to generate a light signal. In an EML application, transmitter 12 can supply an electrical signal to a modulator on TOSA 14 (not shown) rather than laser diode 15.

Transmitter 12 may include a serializer function that converts parallel data into serial data. For example, transmitter 12 may be part of a SerDes circuit. Parallel data may be data (e.g., digital codes) carried by multiple channels concurrently on a parallel interface between DSP 10 and transmitter 12. Transmitter 12 can serialize the parallel data into serial data, where the serial data may be data (e.g., digital codes) carried sequentially by a single channel of a serial interface. In other embodiments, the serializer function is part of DSP 10 rather than part of transmitter 12. In such embodiments, DSP 10 supplies the serial data to transmitter 12.

In embodiments, the transmitted signal may have a waveform that encodes data in the amplitude of pulses, which is referred to as pulse-amplitude modulation (PAM). The number of discrete amplitudes of the pulses can be a power of two. For example, in two-level PAM (PAM-2), there are $2^1$ (two) possible discrete pulse amplitudes; in four-level PAM (PAM-4), there are $2^2$ (four) possible discrete pulse amplitudes; and so on. Each pulse amplitude can map to a symbol and each symbol can convey $\log_2(j)$ bits, where j is the number of discrete pulse amplitudes. For example, in PAM-2, there are two possible symbols each conveying one bit; in PAM-4 there are four possible symbols each conveying two bits; and so on. PAM-2 modulation may also be referred to as non-return-to-zero (NRZ) modulation. Thus, the transmitted signal may convey a series of symbols representing transmitted data. The number of symbols transmitted per second may be referred to as the baud rate. The number of bits-per-symbol multiplied by the baud rate may be referred to as the bit rate. For example, assuming PAM-4 modulation, the baud rate of the transmitted signal may be 25 gigabaud (GBd) and the bit rate may be 50 gigabits per second (Gbps).

Transmitter 12 can include an output 48 comprising a terminal 48P and a terminal 48N. A terminal may be a node at the boundary of a circuit. A node may be a coupling of two or more circuit components. A branch may be any circuit component(s) between two nodes. A voltage at a node that varies over time may be referred to as a voltage signal. A current in a branch that varies over time may be referred to as a current signal. Terminal 48P may be coupled to a conductor 18P of transmission line 18, and terminal 48N may be coupled to a conductor 18N of transmission line 18. In embodiments, transmitter 12 may use differential signaling. Differential signaling may be transmission using two complementary signals. In differential signaling, the voltage signal at terminal 48P may be complementary to the voltage signal at terminal 48N (e.g., the voltage signals may be 180 degrees out of phase). A voltage swing of the transmitted signal may be the peak-to-peak amplitude of the difference between the voltage signal at terminal 48P and the voltage signal at terminal 48N (referred to herein as $V_{dpp}$). The voltage swing at output 48 can be dictated by the change in voltage that appears across laser diode 15 when driving a current signal through laser diode 15 (e.g., as dictated by the light-current-voltage (LIV) curve of laser diode 15).

Transmitter 12 can include a driver 25 coupled to output 48. A driver may be a circuit that controls a signal supplied to a circuit, which may be referred to as a load circuit of the driver. In embodiments, driver 25 may be a current-mode DAC driver. A current-mode driver may be a driver that controls a current signal supplied to a load circuit. A DAC may be a circuit that converts a discrete-time input (e.g., digital input) into a continuous-time output (e.g., analog output). A current-mode DAC driver may be a circuit that supplies a current signal to a load circuit under control of a DAC. The load circuit of driver 25 can include laser diode 15 having its anode coupled to terminal 48P and its cathode coupled to terminal 48N. The load circuit can also include an impedance 13 of transmitter 12 that is in parallel with laser diode 15. In embodiments, impedance 13 can be a parallel termination of transmission line 18 (e.g., impedance 13 can be coupled between terminals 48P and 48N). A termination of a transmission line may have an impedance that matches or approximately matches the characteristic impedance of the transmission line. IC 11 can include coupling capacitors (not shown) to alternating-current (AC)-couple driver 25 to transmission line 18. Alternatively, TOS 14 can include coupling capacitors (not shown) to AC-couple laser diode 15 to transmission line 18. IC 11 or laser 14 can include a bias circuit (not shown) for biasing laser diode 15 to a forward-bias condition.

Figure 2:
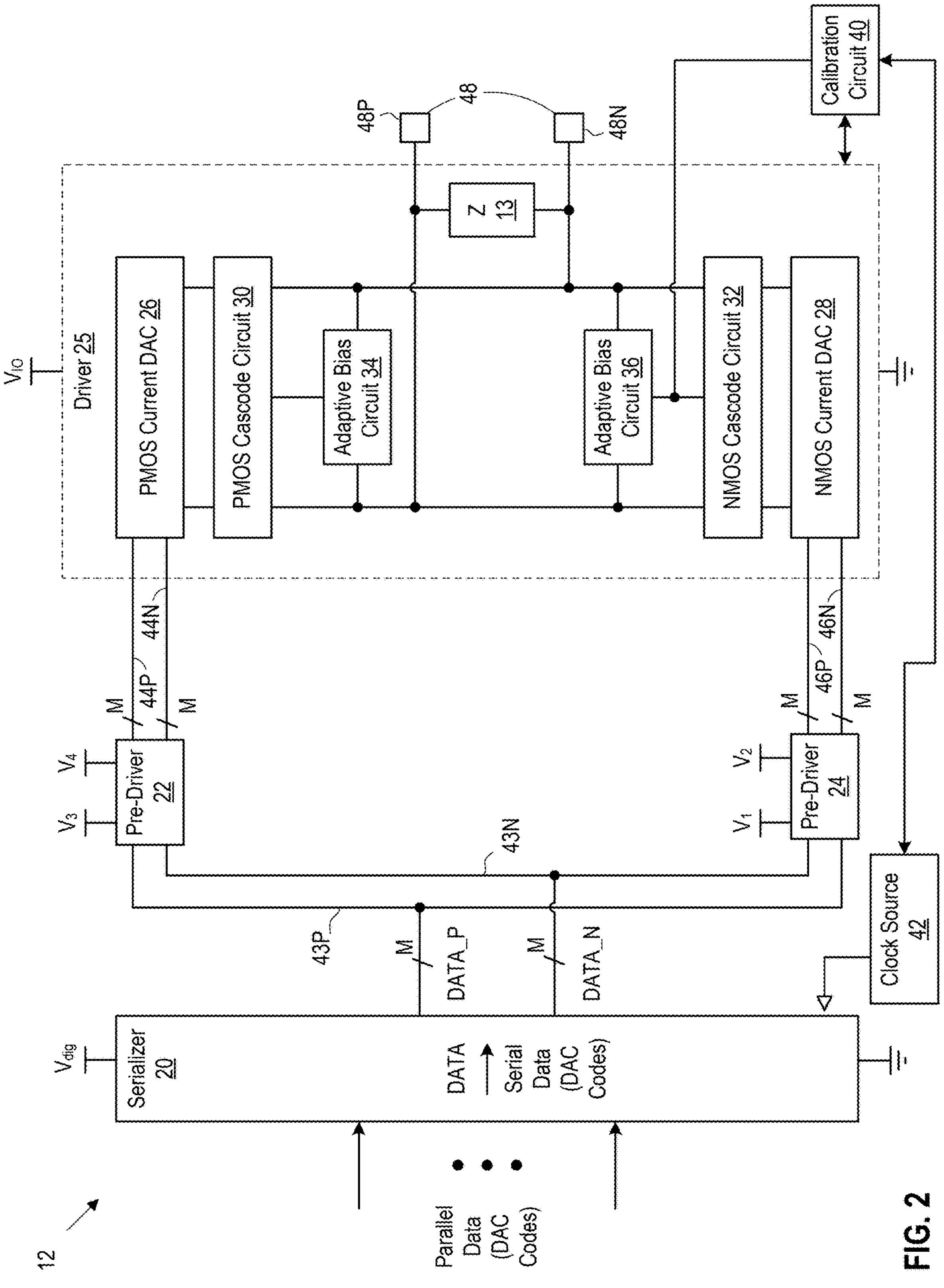
FIG. 2 is a block diagram depicting a transmitter according to some embodiments.
Figure 3:
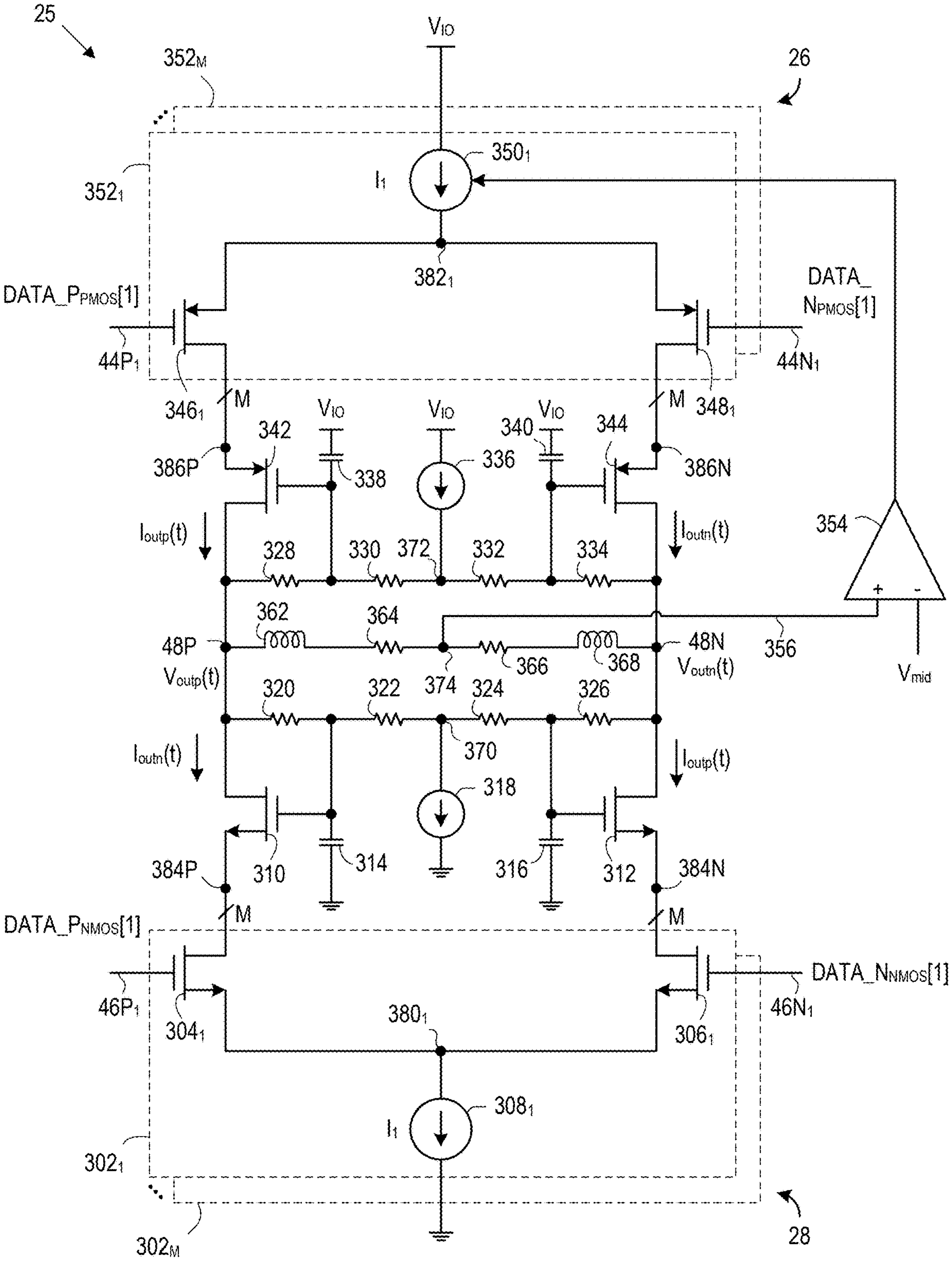
FIG. 3 is a schematic diagram depicting a driver according to embodiments.
Figure 9:
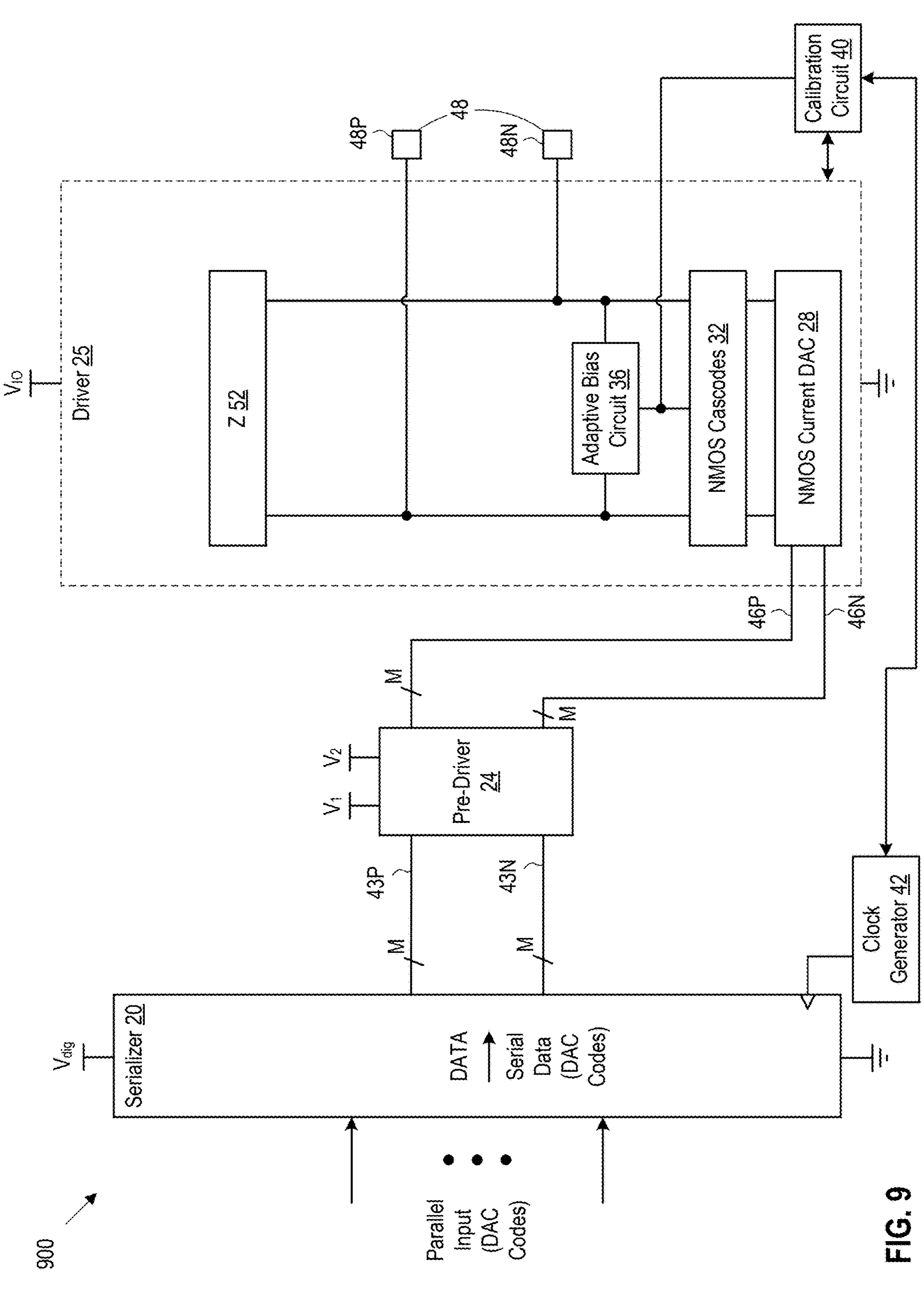
FIG. 9 is a block diagram depicting a transmitter according to other embodiments.
Figure 10:
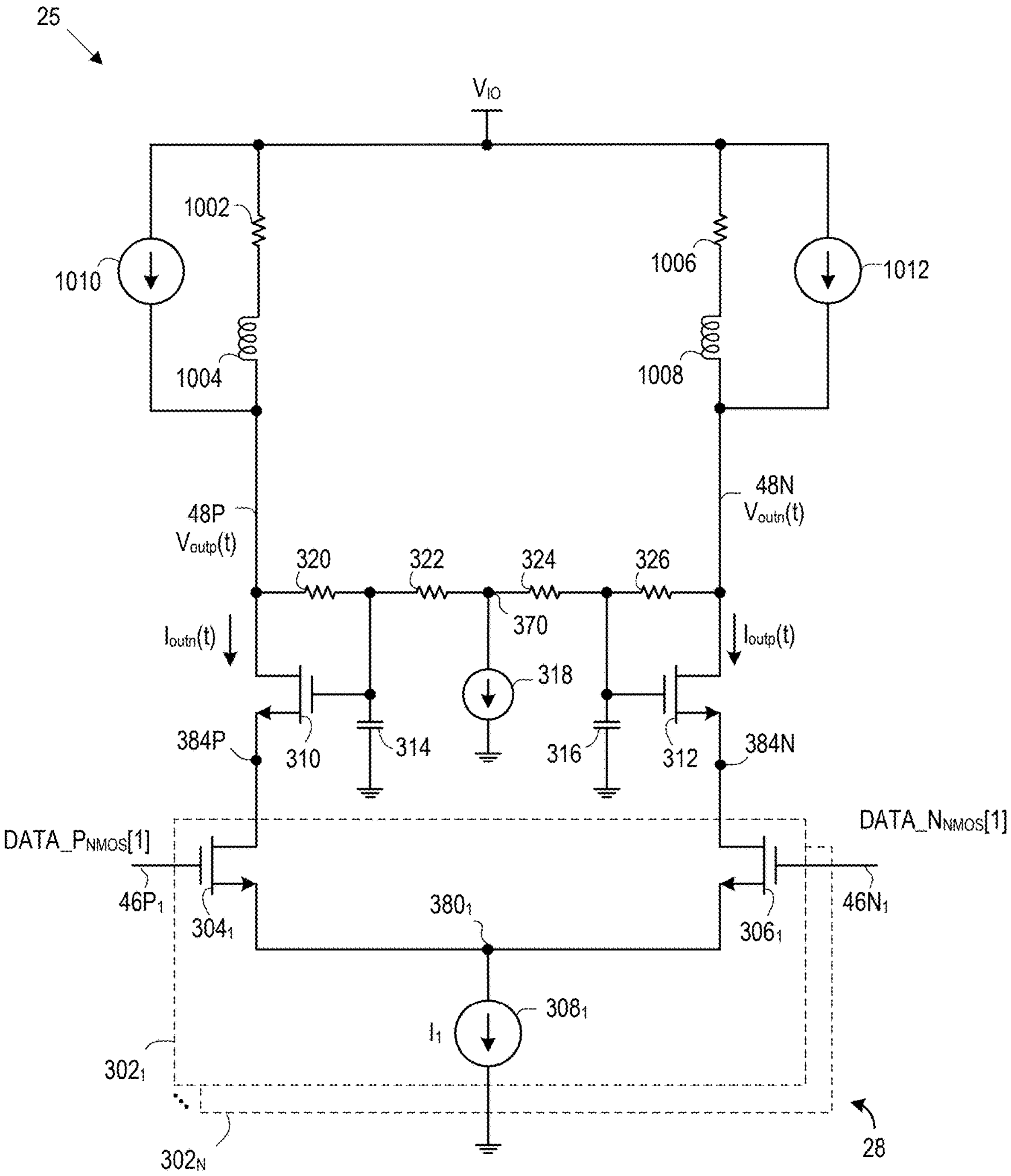
FIG. 10 is a schematic diagram depicting a driver according to the other embodiments of FIG. 9.

An embodiment of driver 25 is shown in FIGS. 2-3 and described below. Another embodiment of driver 25 is shown in FIGS. 9-10 and described below. As described further herein, driver 25 can include a shared cascode circuit at output 48 that improves reliability of the driver. Further, driver 25 can include an adaptive bias circuit for providing an adaptive bias to the shared cascode circuit. The adaptive bias circuit can increase the reliable and linear region of the driver output.

Communication circuit 100 shown in FIG. 1 is an example application in which driver 25 described herein can be deployed. There can be many variations of communication circuit 100, some of which are described in embodiments above. Another variation can be coupling transmitter 12 to a receiver other than TOSA 14, such as a receiver that recovers the data from the transmitted signal. Embodiments of driver 25 that can be used in various applications are described below. For example, driver 25 can be part of a transmitter. The transmitter can be stand-alone or part of a transceiver. The transceiver can be stand-alone or part of a SerDes. Driver 25 can be coupled to various types of loads.

FIG. 2 is a block diagram depicting transmitter 12 according to some embodiments. Transmitter 12 can include a serializer 20, a pre-driver 22, a pre-driver 24, clock source 42, a calibration circuit 40, and driver 25. A serializer may be a circuit that converts parallel data into serial data. Serializer 20 can have an input that receives parallel data from DSP 10. The parallel data can include multiple streams of DAC codes. A DAC code may be a binary code for input to a DAC. A stream of digital codes (e.g., DAC codes) may be a series of binary codes having a rate based on a clock. DSP 10 can map data to symbols (e.g., PAM symbols) and generate DAC codes for input to driver 25 to output the transmitted signal. Serializer 20 can interleave the parallel data to generate serial data comprising a stream of DAC codes. In the example, each DAC code comprises M bits, where M is a positive integer.

A clock source may be a circuit that supplies one or more clock signals. A clock signal (also referred to as a clock) may be a logic signal that oscillates between a high logic state and a low logic state ideally at a constant frequency. Clock source 42 can supply clock(s) to serializer 20 and serializer 20 can use the clock(s) to generate the serial data by interleaving the parallel data. Serializer 20 can be coupled to a voltage supply $V_{dig}$ and electrical ground (e.g., 0 V). Electrical ground can be a reference from which voltages are measured. A voltage supply may be a source of voltage (e.g., a voltage regulator or the like). Serializer 20 can generate an M-bit signal comprising a stream of DAC codes (referred to DATA). Serializer 20 can output the DATA signal to an interface 43P and output a logical complement of the DATA signal to an interface 43N. An X-bit signal may be a set of X logic signals, X>0. A logic signal may be a signal that has either a high logic state or a low logic state at discrete times. The M-bit signal on interface 43P may be referred to as a signal DATA_P, and the M-bit signal on interface 43N may be referred to as a signal DATA_N, where DATA_N is the logical complement of DATA_P. The DATA signal may be referred to as the data signal and the DATA_P and DATA_N signals may be referred to complementary data signals. In some embodiments, serializer 20 may be omitted from transmitter 12 (e.g., the function of serializer 20 may be performed by another circuit, such as DSP 10). In such embodiments, transmitter 12 may receive the complementary data signals from another circuit (e.g., DSP 10).

Driver 25 can include a p-type metal oxide semiconductor (PMOS) current DAC 26, an n-type metal oxide semiconductor (NMOS) current DAC 28, a PMOS cascode circuit 30, an NMOS cascode circuit 32, an adaptive bias circuit 34, an adaptive bias circuit 36, and output impedance 13. Driver 25 may be coupled to a voltage supply $V_{IO}$ and electrical ground. The load circuit of driver 25 can be a current divider formed by output impedance 13, adaptive bias circuit 34, adaptive bias circuit 36, and laser diode 15 (or other circuit as discussed above). A current DAC may be a DAC that converts a discrete-time input (e.g., M-bit DAC codes) into a current signal through a load circuit. An NMOS current DAC may be a current DAC implemented using NMOS transistors (e.g., n-type metal-oxide semiconductor field-effect transistors (MOSFETs)). A PMOS current DAC may be a current DAC implemented using PMOS transistors (e.g., p-type MOSFETS).

Each pre-driver 22, 24 includes an input and an output. An input of pre-driver 22 can be coupled to both interfaces 43P and 43N. Likewise, an input of pre-driver 24 can be coupled to both interfaces 43P and 43N. A pre-driver may be a circuit that conditions a signal for input to a driver. Pre-driver 24 may condition DATA_P and DATA_N signals for input to NMOS current DAC 28. Pre-driver 24 can be coupled to a voltage supply $V_1$ and a voltage supply $V_2$. Pre-driver 24 can level-shift the DATA_P and DATA_N signals. For example, logic low of the data signals can be shifted from 0 V to $V_1$ and logic high of the data signals can be shifted from $V_{dig}$ to $V_2$. Pre-driver 24 can output the DATA_P signal as conditioned (referred to as $DATA\_P_{NMOS}$) on an interface 46P and the DATA_N signal as conditioned (referred to as $DATA\_N_{NMOS}$) on an interface 46N. Pre-driver 22 may condition the DATA_P and DATA_N signals for input to PMOS current DAC 26. Pre-driver 22 can be coupled to a voltage supply $V_3$ and a voltage supply $V_4$. Pre-driver 22 can level-shift the DATA_P and DATA_N signals. For example, logic low of the data signals can be shifted from 0 V to $V_3$ and logic high of the data signals can be shifted from $V_{dig}$ to $V_4$. Pre-driver 22 can output the DATA_P signal as conditioned (referred to as $DATA\_P_{PMOS}$) on an interface 44P and the DATA_N signal as conditioned (referred to as $DATA\_N_{PMOS}$) on an interface 44N.

Driver 25 can include an input and an output. The input of driver 25 can be coupled to interfaces 44P, 44N, 46P, and 46N. The output of driver 25 can be coupled to output 48. NMOS current DAC 28 includes an input and an output. The input of NMOS current DAC 28 can receive the conditioned data signals ($DATA\_P_{NMOS}$ and $DATA\_N_{NMOS}$) from pre-driver 24. The output of NMOS current DAC 28 can be coupled to output 48 through NMOS cascode circuit 32. The input of PMOS current DAC 26 can receive conditioned data signals ($DATA\_P_{PMOS}$ and $DATA\_N_{PMOS}$) from pre-driver 22. The output of PMOS current DAC 26 can be coupled to output 48 through PMOS cascode circuit 30.

NMOS cascode circuit 32 can be coupled between NMOS current DAC 28 and output 48. PMOS cascode circuit 30 can be coupled between PMOS current DAC 26 and output 48. Transistors may be coupled in cascode when the drain of a first transistor is coupled to the source of a second transistor, the gate of the first transistor receives an input signal, and the drain of the second transistor supplies an output signal. In such a circuit arrangement, the second transistor may be referred to as a cascode transistor. NMOS cascode circuit 32 can include NMOS transistors coupled in cascode with switch transistors in NMOS current DAC 28. Likewise, PMOS cascode circuit 30 can include PMOS transistors coupled in cascode with switch transistors in PMOS current DAC 26. Some advantages of NMOS cascode circuit 32 and PMOS cascode circuit 30 are described below.

An adaptive bias circuit may be a circuit that supplies a variable bias to another circuit based on some feedback. Adaptive bias circuit 36 can be coupled to output 48 and NMOS cascode circuit 32. Adaptive bias circuit 36 can supply a bias voltage to NMOS cascode circuit 32 based on the voltage signals at terminals 48P, 48N. Adaptive bias circuit 34 can be coupled to output 48 and PMOS cascode circuit 30. Adaptive bias circuit 34 can supply a bias voltage to PMOS cascode circuit 30 based on the voltage signals at terminals 48P, 48N. Some advantages provided by adaptive bias circuits 34 and 36 are described below.

Calibration circuit 40 may be a circuit that calibrates transmitter 12. As used herein, "calibrate" can mean to adjust within a desired precision to achieve a particular function. Calibration circuit 40 can calibrate driver 25, clock source 42, or both to achieve the function of compensating for circuit non-idealities, such as even-odd jitter (EOJ), integral non-linearity (INL), and the like. Calibration circuit 40 can include an interface with clock source 42 for manipulating device(s) thereof (e.g., adjust a phase interpolator (PI) of clock source 42). Calibration circuit 40 can include an interface with driver 25 for manipulating devices thereof (e.g., adjusting current sources, resistances, capacitances, etc.). Calibration circuit 40 can determine the manipulations of devices in clock source 42 and driver 25 in response to an input from driver 25. In embodiments, the input of calibration circuit 40 is coupled to the output of adaptive bias circuit 36 that supplies the bias voltage to NMOS cascode circuit 32. Some advantages to feeding calibration circuit 40 using the bias output of the adaptive bias circuit are discussed below.

FIG. 3 is a schematic diagram depicting driver 25 according to embodiments. NMOS current DAC 28 can include M circuits $302_1 \ldots 302_M$ referred to as "slices." Each slice $302_1 \ldots 302_M$ can include a transistor switch coupled to a current source. A transistor switch may be a switch implemented using transistor(s). In embodiments, each transistor switch may include a pair of transistors configured as a differential transistor pair. A differential transistor pair may be an arrangement where the sources of first and second transistors are coupled to a node (e.g., a common source node), and the gates of the first and second transistors respectively receive complementary data signals. A differential transistor pair can function to connect one of the two drains to the common source node based on the complementary data signals. A current source may be a circuit that supplies or draws a current independent of voltage across the circuit less than a compliance voltage (e.g., the maximum voltage the current source can supply to a load beyond the circuit stops being a current source).

The transistors in driver 25 can be field effect transistors (FETs). A FET can be a four-terminal device having gate, source, drain, and substrate terminals. Unless otherwise indicated, the transistors described herein have their substrate terminals coupled to their source terminals and, as such, the substrate terminals are not explicitly shown. FETs can be p-channel FETs or n-channel FETs, where n and p refer to the type of doping in the semiconductor material and the type of majority charge carrier, as is known in the art. Consistent with convention, any n-channel transistors are shown schematically with the source as an arrow facing away from the gate and any p-channel transistors are shown schematically with the source as an arrow facing towards the gate. There are many types of FETs known in the art. One skilled in the art can select among one or more such FETs based on the description of the examples and embodiments herein. MOSFETs are widely used and well-known FETs in CMOS-based ICs. P-channel MOSFETs can be referred to as PMOS transistors and N-channel MOSFETs can be referred to as NMOS transistors. Accordingly, for purposes of clarity, various examples and embodiments are described herein within the context of NMOS transistors, PMOS transistors, or a combination thereof.

For purposes of clarity by example, FIG. 3 shows only slice $302_1$ in detail. Slice $302_1$ can include an NMOS transistor $304_1$, an NMOS transistor $306_1$, and a current source $308_1$. Sources of NMOS transistor $304_1$ and NMOS transistor $306_1$ can be coupled to a node $380_1$. Such an arrangement may be referred to as a source-coupled transistor pair or source-coupled transistors. Current source $308_1$ can be coupled between node $380_1$ and electrical ground. Current source $308_1$ can supply a current $I_1$. A gate of NMOS transistor $304_1$ can be coupled to a conductor $46P_1$ of interface 46P to receive a first bit of the $DATA\_P_{NMOS}$ signal (referred to as $DATA\_P_{NMOS}[1]$). A gate of NMOS transistor $306_1$ can be coupled to a conductor $46N_1$ of interface 46N to receive a first bit of the $DATA\_N_{NMOS}$ signal (referred to as $DATA\_N_{NMOS}[1]$). The source-coupled transistors $304_1$, $306_1$ are thus a differential transistor pair implementing a transistor switch.

Others of slices $302_2 \ldots 302_M$ have the same structure such that a kth slice $302_k$ includes an NMOS transistor $304_k$ (not shown), an NMOS transistor $306_k$ (not shown), and a current source $308_k$ (not shown), where $k \in [2, M]$. Sources of NMOS transistors $304_k$, $306_k$ can be coupled to a node $380_k$. Current source $308_k$ can be coupled between node $380_k$ and electrical ground. Current source $308_k$ can supply a current $I_k$. A gate NMOS transistor $304_k$ can be coupled to a conductor $46P_k$ (not shown) of interface 46P to receive a kth bit of the $DATA\_P_{NMOS}$ signal ($DATA\_P_{NMOS}$ [k]). A gate of NMOS transistor $306_k$ can be coupled to a conductor $46N_k$ (not shown) of interface 46N to receive a kth bit of the DATA_$N_{NMOS}$ signal (DATA_$N_{NMOS}$ [k]).

In some embodiments, the currents $I_1 \ldots I_M$ can be binary weighted (e.g., each current $I_{k+1}$ being twice as much as current $I_k$ for k∈[1, M−1]. In some embodiments, the currents $I_1 \ldots I_M$ can be the same or approximately the same. In some embodiments, some subset(s) of the currents $I_1 \ldots I_M$ can be binary weighted and other subset(s) of the currents $I_1 \ldots I_M$ can be the same or approximately the same. In some embodiments, the currents $I_1 \ldots I_M$ can be thermometer weighted or segmented using a combination of thermometer and binary weighting.

PMOS current DAC 28 can include M slices $\mathbf{352}_1 \ldots \mathbf{352}_M$. Each slice $\mathbf{352}_1 \ldots \mathbf{352}_M$ can include a transistor switch coupled to a current source. For purposes of clarity by example, FIG. 3 shows only slice $\mathbf{352}_1$ in detail. Slice $\mathbf{352}_1$ can include an PMOS transistor $\mathbf{346}_1$, an PMOS transistor $\mathbf{348}_1$, and a current source $\mathbf{350}_1$. Sources of PMOS transistors $\mathbf{346}_1$ and $\mathbf{348}_1$ can be coupled to a node $\mathbf{382}_1$. Current source $\mathbf{350}_1$ can be coupled between node $\mathbf{382}_1$ and the voltage supply $V_{IO}$. Current source $\mathbf{350}_1$ can supply the current $I_1$. A gate of PMOS transistor $\mathbf{346}_1$ can be coupled to a conductor $\mathbf{44}P_1$ of interface 44P to receive a first bit of the signal DATA_$P_{PMOS}$ (referred to as DATA_$P_{PMOS}$[1]). A gate of PMOS transistor $\mathbf{348}_1$ can be coupled to a conductor 44N, of interface 44N to receive a first bit of the signal DATA_$N_{PMOS}$ (referred to as DATA_$N_{PMOS}$[1]). The source-coupled transistors $\mathbf{346}_1$, $\mathbf{348}_1$ are thus a differential transistor pair implementing a transistor switch.

Others of slices $\mathbf{352}_2 \ldots \mathbf{352}_M$ have the same structure such that a kth slice includes an PMOS transistor $\mathbf{346}_k$ (not shown), an PMOS transistor $\mathbf{348}_k$ (not shown), and a current source $\mathbf{350}_k$ (not shown), where k∈[2, N]. Sources of PMOS transistors $\mathbf{346}_k$, $\mathbf{348}_k$ can be coupled to a node $\mathbf{382}_k$. Current source $\mathbf{350}_k$ can be coupled between node $\mathbf{382}_1$ and the voltage supply $V_{IO}$. Current source $\mathbf{350}_k$ can supply the current Ix. A gate PMOS transistor $\mathbf{346}_1$ can be coupled to a conductor $\mathbf{44}P_k$ (not shown) of interface 44P to receive a kth bit of the signal DATA_$P_{PMOS}$ (DATA_$P_{PMOS}$[k]). A gate of PMOS transistor $\mathbf{348}_k$ can be coupled to a conductor $\mathbf{44}N_k$ (not shown) of interface 44N to receive a kth bit of the signal DATA_$N_{PMOS}$ (DATA_$N_{PMOS}$[k]).

Drains of NMOS transistors $\mathbf{304}_1 \ldots \mathbf{304}_M$, and a source of an NMOS transistor 310, can be coupled to a node 384P. Drains of NMOS transistors $\mathbf{306}_1 \ldots \mathbf{306}_M$, and a source of and NMOS transistor 312, can be coupled to a node 384N. NMOS transistors 310 and 312 can be cascode transistors of NMOS cascode circuit 32. The drain of NMOS transistor 310 can be coupled to terminal 48P. The drain of NMOS transistor 312 can be coupled to terminal 48N. Thus, NMOS transistor 310 can be coupled between the transistor switches of NMOS current DAC 28 and terminal 48P. Likewise, NMOS transistor 312 can be coupled between the transistor switches of NMOS current DAC 28 and terminal 48N.

Drains of PMOS transistors $\mathbf{346}_1 \ldots \mathbf{346}_M$, and a source of PMOS transistor 342, can be coupled to a node 386P. Drains of PMOS transistors $\mathbf{348}_1 \ldots \mathbf{348}_M$, and a source of PMOS transistor 344, can be coupled to a node 386N. PMOS transistors 342 and 344 can be cascode transistors of PMOS cascode circuit 30. The drain of PMOS transistor 342 can be coupled to terminal 48P. The drain of PMOS transistor 344 can be coupled to terminal 48N. Thus, PMOS transistor 342 can be coupled between the transistor switches of PMOS current DAC 26 and terminal 48P. Likewise, PMOS transistor 344 can be coupled between the transistor switches of PMOS current DAC 26 and terminal 48N.

In embodiments, adaptive bias circuit 36 may include a resistors 320, 322, 324, and 326, capacitors 314 and 316, and a current source 318. Resistor 320 can be coupled between terminal 48P and the gate of NMOS transistor 310. Resistor 326 can be coupled between terminal 48N and the gate of NMOS transistor 312. Resistor 322 can be coupled between the gate of NMOS transistor 310 and a node 370. Resistor 324 can be coupled between the gate of NMOS transistor 312 and node 370. Current source 318 can be coupled between node 370 and electrical ground. Current source 318 can pull a current from node 370. Capacitor 314 can be coupled between the gate of NMOS transistor 310 and electrical ground. Capacitor 316 can be coupled between the gate of NMOS transistor 312 and electrical ground.

In embodiments, adaptive bias circuit 34 includes resistors 328, 330, 332, and 334, capacitors 338 and 340, and a current source 336. Resistor 328 can be coupled between terminal 48P and the gate of PMOS transistor 342. Resistor 334 can be coupled between terminal 48N and the gate of PMOS transistor 344. Resistor 330 can be coupled between the gate of PMOS transistor 342 and a node 372. Resistor 332 can be coupled between the gate of PMOS transistor 344 and node 372. Current source 336 can be coupled between the voltage supply $V_{IO}$ and node 372. Current source 336 can supply current to node 372. Capacitor 338 can be coupled between the gate of PMOS transistor 342 and the voltage supply $V_{IO}$. Capacitor 340 can be coupled between the gate of PMOS transistor 344 and the voltage supply $V_{IO}$.

In embodiments, impedance 13 may include an inductor 362, a resistor 364, a resistor 366, and an inductor 368. A series combination of inductor 362 and resistor 364 can be coupled between terminal 48P and a node 374. A series combination of inductor 368 and resistor 366 can be coupled between terminal 48N and node 374. Node 374 can be disposed between resistors 364 and 366.

Driver 25 can include a common-mode feedback circuit, which can include an operational amplifier 354. A non-inverting terminal of operational amplifier 354 can be coupled to node 374. An inverting terminal of operational amplifier 354 can be coupled to a voltage supply $V_{mid}$. An output of operational amplifier 354 can be coupled to control inputs of current sources $\mathbf{350}_1 \ldots \mathbf{350}_M$. The voltage signal at terminal 48P may be referred to as $V_{outp}(t)$ and the voltage signal at terminal 48N may be referred to as $V_{outn}(t)$. The differential output voltage at output 48 may be $V_{ou}(t)=V_{outp}(t)-V_{outn}(t)$. The voltage $V_{mid}$ may be a fixed voltage set to half of approximately half of $V_{IO}$.

In operation, PMOS current DAC 26 can supply, and NMOS current DAC 28 can sink, a total current $I_{DAC}$ equal to $I_1+I_2+\ldots+I_{M-1}+I_M$. A first portion of $I_{DAC}$ can flow through PMOS transistor 342, the load circuit, and NMOS transistor 312. A second and remaining portion of $I_{DAC}$ can flow through PMOS transistor 344, the load circuit, and NMOS transistor 310. Those first and second portions of $I_{DAC}$ vary over time based on the DAC codes of the data signal. Thus, a current signal $I_{outp}(t)$ flows through PMOS transistor 342 and NMOS transistor 312, and a current signal $I_{outn}(t)$ flows through PMOS transistor 344 and NMOS transistor 310. The differential output current supplied to the load circuit may be $I_{out}(t)=I_{outp}(t)-I_{outn}(t)$. In the example of FIGS. 1-3, the load circuit may be the current divider formed by impedance 13, laser diode 15, adaptive bias circuit 34, and adaptive bias circuit 36. The impedance of adaptive bias circuits 34 and 36 can be such that those circuits draw only a small amount of the differential output current and that the majority of the differential output current is split between impedance 13 and laser diode 15. The voltage swing across impedance 13 and laser diode 15 be the differential output voltage. Operational amplifier 354 can operate to maintain the midpoint of the differential output voltage at $V_{mid}$.

A driver can be implemented using an NMOS current DAC and a PMOS current DAC without the NMOS and PMOS cascodes and adaptive bias circuits of the embodiments. In such a cascode-less implementation, a driver with core transistors as the switch transistors can be reliably used for low voltage swing applications (e.g., less than or equal to 1.5 Vdpp). Core transistors may be those transistors in the IC fabricated at or near the minimum dimensions of the fabrication process (referred to as the technology node). Core transistors may comprise the bulk of the transistors on an IC. For higher voltage swing applications (e.g., greater than 1.5 Vdpp), protection cascodes can be used for large signal reliability and to minimize device aging. In some implementations, the cascode transistors can be IO transistors designed to handle large voltage excursions. The IO cascode transistors can be biased with a fixed voltage. In complementary metal oxide semiconductor (CMOS) technology, an IO transistor can have a much larger gate area compared to a core transistor and can have a thicker gate oxide than a core transistor. Using IO transistors as cascodes increases the parasitic capacitance at the driver output, which can limit the driver bandwidth.

Alternatively, the cascode transistors can be core transistors to mitigate the bandwidth limitation. The core cascode transistors can be biased with a fixed voltage. Such a design, however, is both reliability- and linearity-limited at high voltage swings (e.g., greater than 1.5 Vdpp). This can be illustrated by the example shown in FIG. 4A and the graph shown in FIG. 5A, described below.

Figure 4A:
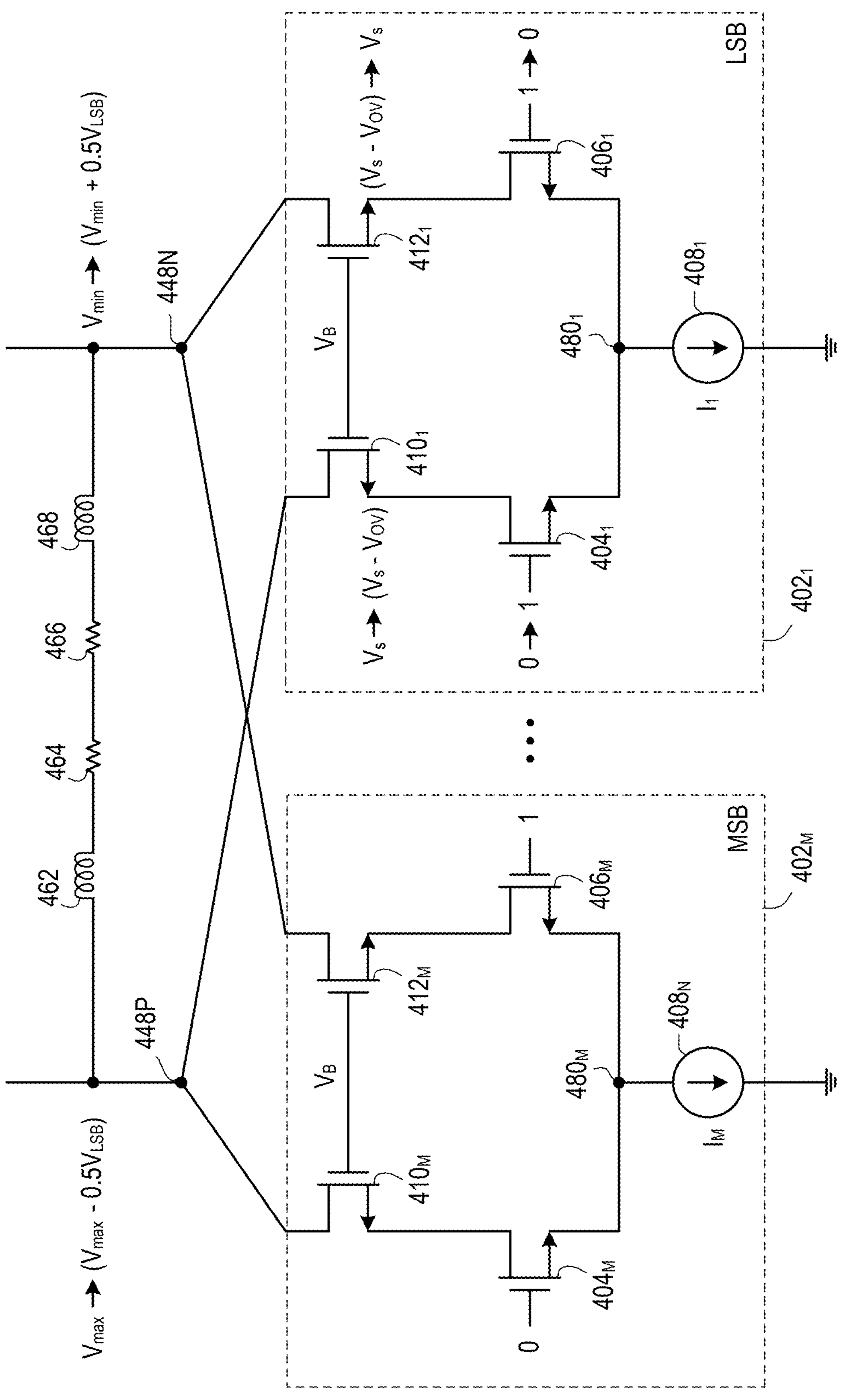
FIG. 4A is a schematic diagram depicting an NMOS current DAC and output impedance portions of a driver.

FIG. 4A is a schematic diagram depicting an NMOS current DAC and output impedance portions of a driver. In the example, the NMOS current DAC can include slices $\mathbf{402}_1 \ldots \mathbf{402}_M$. For clarity, only slices $\mathbf{402}_1$ and $\mathbf{402}_M$ are shown in detail. Each of slices $\mathbf{402}_2 \ldots \mathbf{402}_{M-1}$ can have the same circuit arrangement as that shown for slices $\mathbf{402}_1$ and $\mathbf{402}_M$. Slice $\mathbf{402}_1$ can include an NMOS transistor $\mathbf{404}_1$, an NMOS transistor $\mathbf{406}_1$, a current source $\mathbf{408}_1$, an NMOS transistor $\mathbf{410}_1$, and an NMOS transistor $\mathbf{412}_1$. The sources of NMOS transistor $\mathbf{404}_1$ and $\mathbf{406}_1$ can be coupled to a node $\mathbf{480}_1$. Current source $\mathbf{408}_1$ can be coupled between node $\mathbf{480}_1$ and electrical ground. Current source $\mathbf{408}_1$ can supply a current $I_1$. The drain of NMOS transistor $\mathbf{404}_1$ can be coupled to a source of NMOS transistor $\mathbf{410}_1$. The drain of NMOS transistor $\mathbf{406}_1$ can be coupled to the source of NMOS transistor $\mathbf{412}_1$. The gates of NMOS transistors $\mathbf{410}_1$ and $\mathbf{412}_1$ can be biased with a fixed voltage $V_B$ (using a bias circuit, not shown). The drain of NMOS transistor $\mathbf{410}_1$ can be coupled to a node 448P. The drain of NMOS transistor $\mathbf{412}_1$ can be coupled to a node 448N.

Slice $\mathbf{402}_M$ can include an NMOS transistor $\mathbf{404}_M$, an NMOS transistor $\mathbf{406}_M$, a current source $\mathbf{408}_M$, an NMOS transistor $\mathbf{410}_M$, and an NMOS transistor $\mathbf{412}_M$. The sources of NMOS transistors $\mathbf{404}_M$ and $\mathbf{406}_M$ can be coupled to a node $\mathbf{480}_M$. Current source $\mathbf{408}_M$ can be coupled between node $\mathbf{480}_M$ and electrical ground. Current source $\mathbf{408}_M$ can supply a current $I_M$. The drain of NMOS transistor $\mathbf{404}_M$ can be coupled to a source of NMOS transistor $\mathbf{410}_M$. The drain of NMOS transistor $\mathbf{406}_M$ can be coupled to the source of NMOS transistor $\mathbf{412}_M$. The gates of NMOS transistors $\mathbf{410}_M$ and $\mathbf{412}_M$ can be biased with the fixed voltage $V_B$ (using a bias circuit, not shown). The drain of NMOS transistor $\mathbf{410}_M$ can be coupled to node 448P. The drain of NMOS transistor $\mathbf{412}_M$ can be coupled to node 448N.

The output impedance can include a series combination of an inductor 462, a resistor 464, a resistor 466, and an inductor 468 coupled between nodes 448P and 448N. The currents $I_M \ldots I_1$ can be binary weighted. Slice $\mathbf{402}_1$ may receive a least significant bit (LSB) of the DAC code and slice $\mathbf{402}_M$ may receive a most significant bit (MSB) of the DAC code. Transistors $\mathbf{410}_1 \ldots \mathbf{410}_M$, and transistors $\mathbf{412}_1 \ldots \mathbf{412}_M$, may be core transistors. In the example of FIG. 4A, the cascode transistors are included in each slice. The PMOS current DAC and PMOS cascode transistors are omitted for clarity.

In operation, assume the DAC code of the DATA signal is the minimum DAC code (e.g., 00 . . . 00). Thus, the gates of NMOS transistors $\mathbf{404}_1 \ldots \mathbf{404}_M$ receive the low NMOS gate voltage (denoted by 0) and the gates of NMOS transistors $\mathbf{406}_1 \ldots \mathbf{406}_M$ receive the high NMOS gate voltage (denoted by 1). In slice $\mathbf{402}_1$, the voltage at the source of NMOS transistor $\mathbf{410}_1$ may be $V_S$, and the voltage at the source of NMOS transistor $\mathbf{412}_1$ may be $V_S - V_{OV}$, where $V_{OV}$ the core transistor overdrive voltage. The voltage at node 448P can be $V_{max}$ and the voltage at node 448N can be $V_{min}$.

Assume the DAC code of the DATA signal changes to 00 . . . 01 (e.g., the LSB toggles from 0 to 1 and the MSBs remain the same). In such case, the gate of NMOS transistor $\mathbf{404}_1$ transitions from the low NMOS gate voltage to the high NMOS gate voltage, and the gate of the NMOS transistor $\mathbf{406}_1$ transitions from the high NMOS gate voltage to the low NMOS gate voltage. The source of NMOS transistor $\mathbf{410}_1$ transitions from $V_S$ to $V_S - V_{OV}$. The source of the NMOS transistor $\mathbf{412}_1$ transitions from $V_S - V_{OV}$ to $V_S$. The voltage at node 448P transitions from $V_{max}$ to $V_{max} - 0.5 * V_{LSB}$, and the voltage at node 448N transitions from $V_{min}$ to $V_{min} + 0.5 * V_{LSB}$. The voltage $V_{LSB} = I_1 * R$, where R is the equivalent resistance of the load circuit. When the DAC is at minimum code and the LSB toggles, the output level reduces by $0.5 * V_{LSB}$. However, the voltage at the source of NMOS transistor $\mathbf{410}_1$ reduces by the transistor overdrive voltage $V_{OV}$. The transistor overdrive voltage $V_{OV}$ may be higher than $V_{LSB}$ by a factor of at least ten (e.g., approximately 30 times higher). This increases the cascode transistor $V_{DS}$ (voltage from drain to source) by $V_{OV} - 0.5 * V_{LSB}$, which can cause a significant reliability concern for the device and can result in high hot carrier injection (HCI) and time-dependent dielectric breakdown (TDDB) aging of the cascode transistors.

Figure 5A:
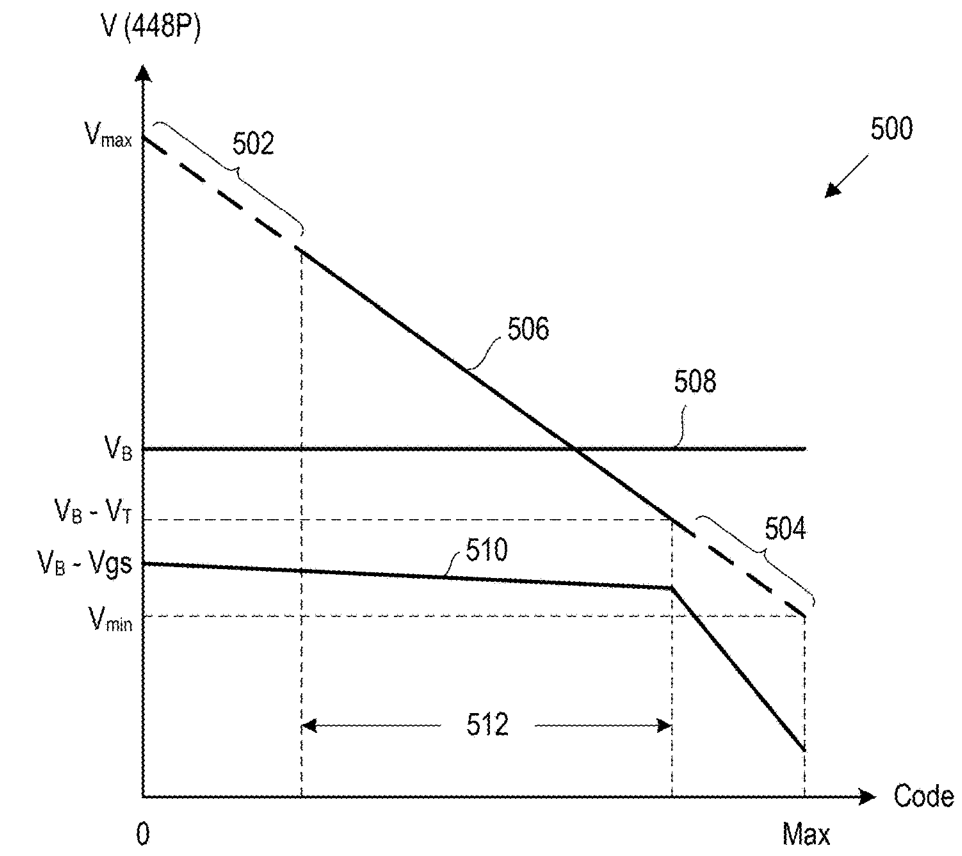
FIG. 5A depicts a graph relating voltages and DAC codes for the driver shown in FIG. 4A.

FIG. 5A depicts a graph 500 relating voltages and DAC codes for the driver shown in FIG. 4A. Graph 500 includes a horizontal axis representing DAC codes from minimum (0) to maximum. Graph 500 includes a vertical axis representing voltage at node 448P. A curve 506 can represent the NMOS cascode drain voltage (e.g., voltage at node 448P). A curve 508 can represent the NMOS cascode gate voltage (e.g., the fixed bias voltage $V_B$). A curve 510 can represent the NMOS cascode source voltage (e.g., voltage at the source of NMOS transistor $\mathbf{410}_1$). As shown by curve 506, the NMOS cascode drain voltage decreases from a $V_{max}$ value to a $V_{min}$ value as the DAC code increases from the minimum DAC code to the maximum DAC code. A region 502 of curve 506 near $V_{max}$ and minimum DAC code exhibits a high cascode $V_{DS}$, which can cause HCI degradation. A region 504 of curve 506 near $V_{min}$ and maximum DAC code corresponds to when the NMOS cascode enters the triode region from the saturation region, which can cause swing compression and AC non-linearity. Region 504 can start when the voltage at node 448P reaches $V_B - V_T$, where $V_T$ is the transistor threshold voltage. Curve 510 shows that the NMOS cascode source voltage falls slightly from $V_B - V_{GS}$ (gate to source voltage) towards $V_{min}$ as the DAC code increases towards maximum. At some DAC code, the NMOS cascode source voltage falls more steeply below $V_{min}$ within region 504 corresponding to the NMOS cascode transistor entering the triode region. A region 512 between the end of region 502 and the beginning of region 504 represents a reliable and linear region of operation. As shown in FIG. 5A, the outer data eyes (e.g., PAM4 data eyes) are compressed due to the reduced headroom at the minimum and maximum DAC codes. Additionally, high-frequency non-linearity can cause different level transitions to have different bandwidths.

Figure 4B:
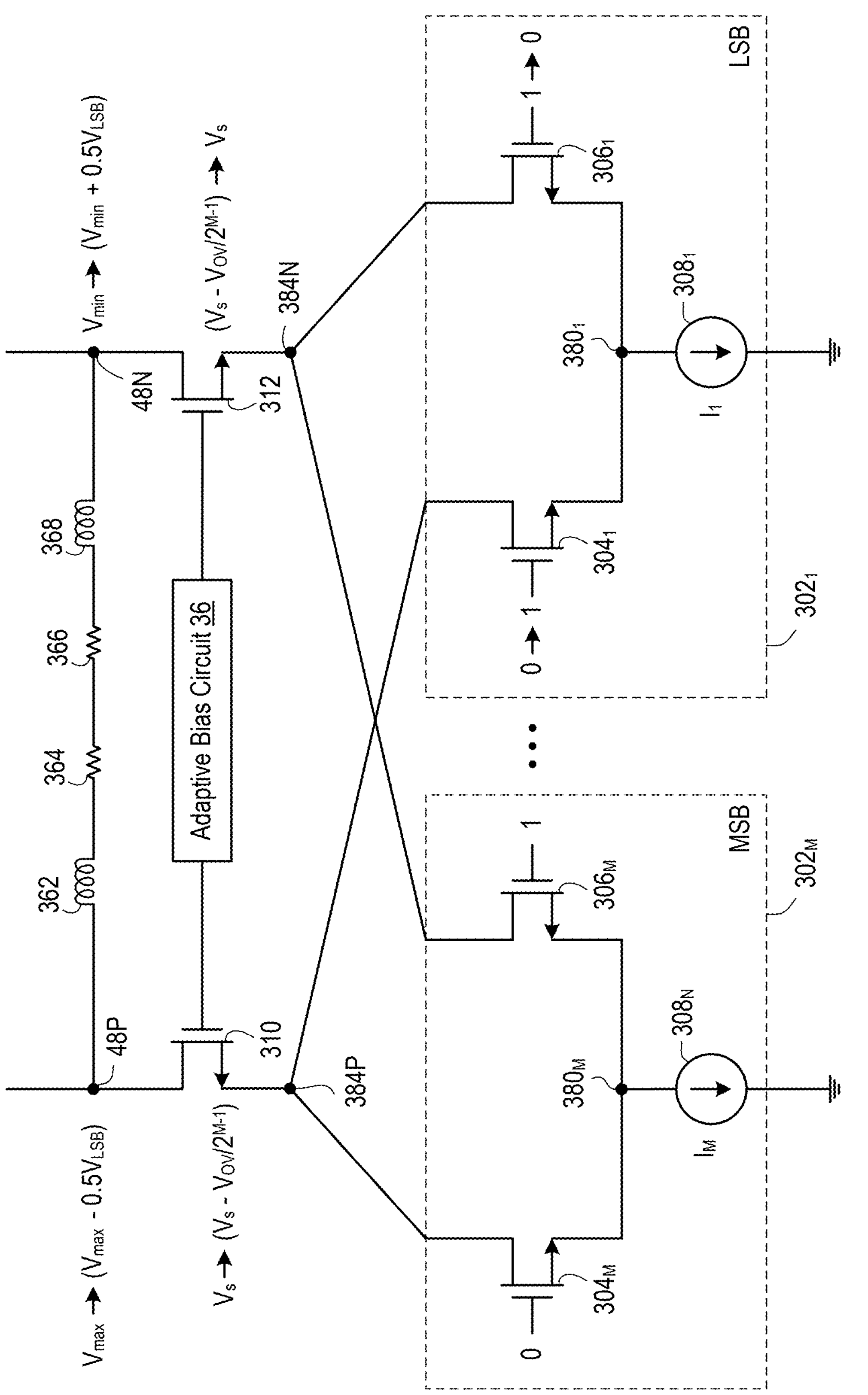
FIG. 4B is a schematic diagram depicting operation of the driver of FIG. 3 according to some embodiments.

FIG. 4B is a schematic diagram depicting operation of driver 25 of FIG. 3 according to some embodiments. Portions of NMOS current DAC 28, NMOS cascode circuit 32, adaptive bias circuit 36, and output impedance 13 are shown. PMOS current DAC 26, PMOS cascode circuit 30, and adaptive bias circuit 34 are omitted for clarity. As shown, driver 25 can include shared cascode transistors, e.g., NMOS transistor 310 and NMOS transistor 312. That is, NMOS transistors $\mathbf{304}_1$ . . . $\mathbf{304}_M$ share a cascode transistor (e.g., NMOS transistor 310). NMOS transistors $\mathbf{306}_1$ . . . $\mathbf{306}_M$ share a cascode transistor (e.g., NMOS transistor 312). This is in contrast to the driver in FIG. 4A, where the cascode transistors are included in each of the slices. The NMOS transistors 310 and 312 can be a parallel combination of core transistors that is sized to carry the current up to $I_{DAC}$. In the example, assume the currents $I_1$ . . . . $I_M$ are binary weighted.

In operation, assume the DAC code of the DATA signal is initially a minimum (e.g., 00 . . . 00). Thus, the gates of NMOS transistors $\mathbf{304}_1$ . . . $\mathbf{304}_M$ receive the low NMOS gate voltage (denoted by 0) and the gates of NMOS transistors $\mathbf{306}_1$ . . . $\mathbf{306}_M$ receive the high NMOS gate voltage (denoted by 1). The voltage at the source of NMOS transistor 312 may be $V_S - V_{OV}/2^{M-1}$. The voltage at the source of NMOS transistor 310 may be $V_S$. The voltage at node 48P can be $V_{max}$ and the voltage at node 48N can be $V_{min}$.

Assume the DAC code of the DATA signal changes to 00 . . . 01 (e.g., the LSB toggles from 0 to 1 and the MSBs remain the same). In such case, the gate of NMOS transistor $\mathbf{304}_1$ transitions from the low NMOS gate voltage to the high NMOS gate voltage, and the gate of the NMOS transistor $\mathbf{306}_1$ transitions from the high NMOS gate voltage to the low NMOS gate voltage. The source of NMOS transistor $\mathbf{310}_1$ transitions from $V_S$ to $V_S - V_{OV}/2^{M-1}$. The source of the NMOS transistor $\mathbf{312}_1$ transitions from $V_S - V_{OV}/2^{M-1}$ to $V_S$. The voltage at node 48P transitions from $V_{max}$ to $V_{max} - 0.5 * V_{LSB}$, and the voltage at node 448N transitions from $V_{min}$ to $V_{min} + 0.5 * V_{LSB}$. When the DAC is at minimum code and the LSB toggles, the output level reduces by $0.5 * V_{LSB}$. The voltage $V_{DS}$ of the cascode transistors changes by $V_{OV}/2^{M-1} - 0.5 * V_{LSB}$, which is a reduction in the change of $V_{DS}$ from the example of FIG. 4A by a factor of $2^{M-1}$. This improves core cascode transistor reliability at the minimum and maximum DAC codes.

Returning to FIG. 3, the reliability and linearity limitations of core cascode transistors can be further alleviated by using adaptive bias circuits 34 and 36. Resistors 320 and 322 form a voltage divider that can provide a fraction of $V_{outp}(t)$ to the gate of NMOS transistor 310. Resistors 326 and 324 form a voltage divider that can provide a fraction of $V_{outn}(t)$ to the gate of NMOS transistor 312. Likewise, resistors 328 and 330 form a voltage divider that can provide a fraction of $V_{outp}(t)$ to the gate of PMOS transistor 342. Resistors 334 and 332 form a voltage divider that can provide a fraction of $V_{outn}(t)$ to the gate of PMOS transistor 344. Adaptive bias circuit 34, 36 can cause the cascode transistor gates to track the output voltage, which minimizes large $V_{DS}/V_{GD}$ excursions. Current sources 318 and 336 can be added to raise/lower the common-mode of the cascode transistor gate voltage as compared to the output common-mode. Capacitors 314, 316, 338, and 340 can be added to optimize the bandwidth at the cascode transistor gates and minimize overshoots/undershoots. The adaptive biasing provided by adaptive bias circuits 34, 36 can distribute the voltage swing at the output between the cascode transistors and the switch transistors.

Figure 6:
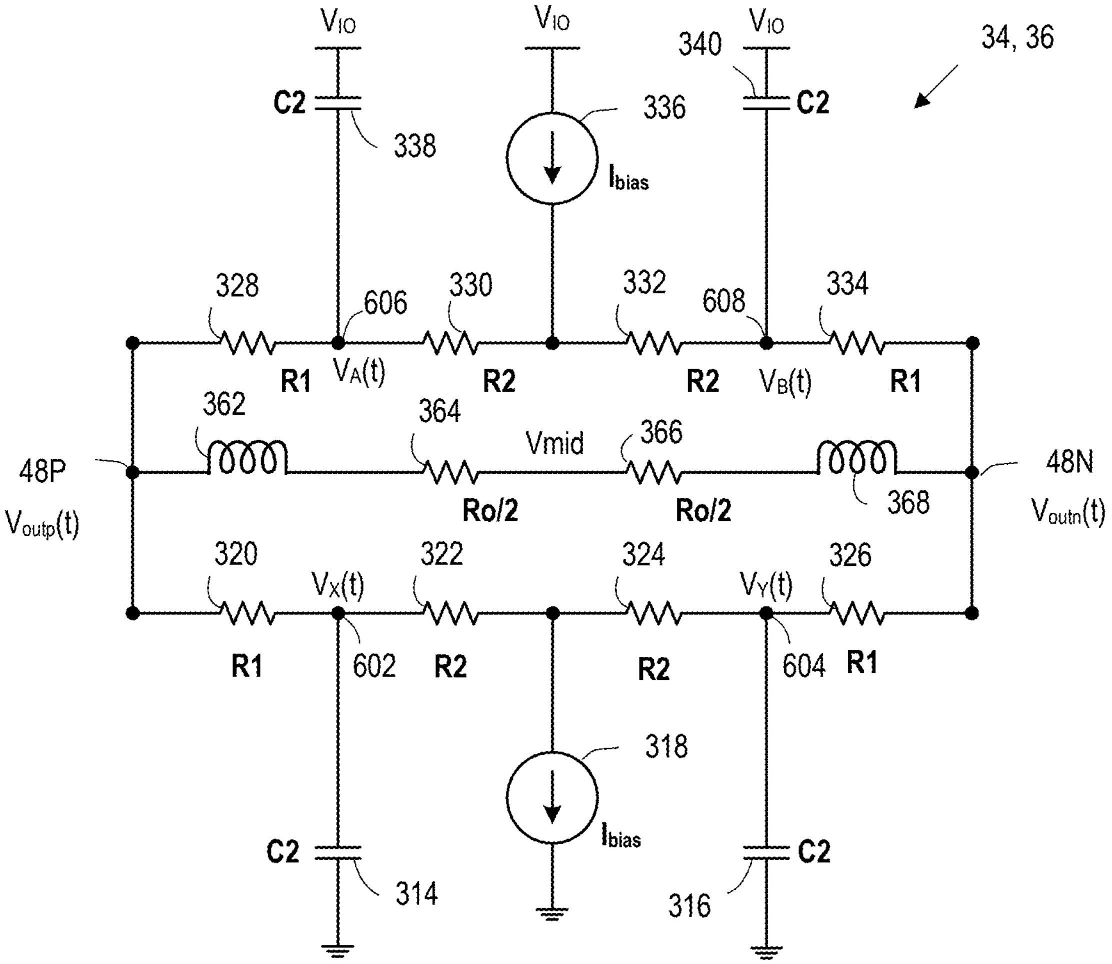
FIG. 6 is a schematic diagram of adaptive bias circuits depicted with resistor, capacitor, and current source values according to some embodiments.

FIG. 6 is a schematic diagram of adaptive bias circuits 34, 36 depicted with resistor, capacitor, and current source values according to some embodiments. In the example, each of capacitors 314, 316, 338, and 340 can have a capacitance C2. Each of resistors 320, 326, 328, and 334 can have a resistance R1. Each of resistors 322, 324, 330, and 332 can have a resistance of R2. Each of current sources 318 and 336 can supply a current $I_{bias}$. The voltage signal at a node 602 comprises the gate voltage of NMOS transistor 310, which is denoted $V_X(t)$. The voltage signal at node 604 comprises the gate voltage of NMOS transistor 312, which is denoted $V_Y(t)$. The voltage signal at node 606 comprises the gate voltage of PMOS transistor 342, which is denoted $V_A(t)$. The voltage signal at node 608 comprises the gate voltage of PMOS transistor 344, which is denoted $V_B(t)$. Each of the resistors 364 and 366 can have a resistance of Ro/2 to match the characteristic impedance of the transmission line.

The advantages of adaptive biasing can be two-fold: (1) a reliability improvement that provides DC $V_{GD}/V_{DS}$ relaxation; and (2) a linearization improvement near minimum and maximum DAC codes. This can relax the reliability/linearity trade-off. Consider:

$$V_{out}(t) = V_{outp}(t) - V_{outn}(t) = \{Ro \| (R1 + R2)\} * I_o(t); \text{ and} \tag{1}$$

$$V_{outp,n}(t) = V_{mid} \pm 1/2 * V_{out}(t). \tag{2}$$

In Equation (1), the symbol || denotes parallel combination and the current signal $I_o$ is the current through output impedance 13. For the NMOS cascode gates:

$$V_{X,Y}(t) = [V_{mid} - (I_{bias} * R1)/2] \pm [1/2 * (R2/(R1 + R2)) * V_{out}(t). \tag{3}$$

In Equation (3), the left side of the ± operator denotes the common-mode component and the right side of the ± operator denotes the amount by which the cascode gates track the output. For the PMOS cascode gates:

$$V_{A,B}(t) = [V_{mid} + (I_{bias} * R1)/2] \pm [1/2 * (R2/(R1 + R2)) * V_{out}(t). \tag{4}$$

In Equation (4), the left side of the ± operator denotes the common-mode component and the right side of the ± denotes the amount by which the cascode gates track the output.

Figure 5B:
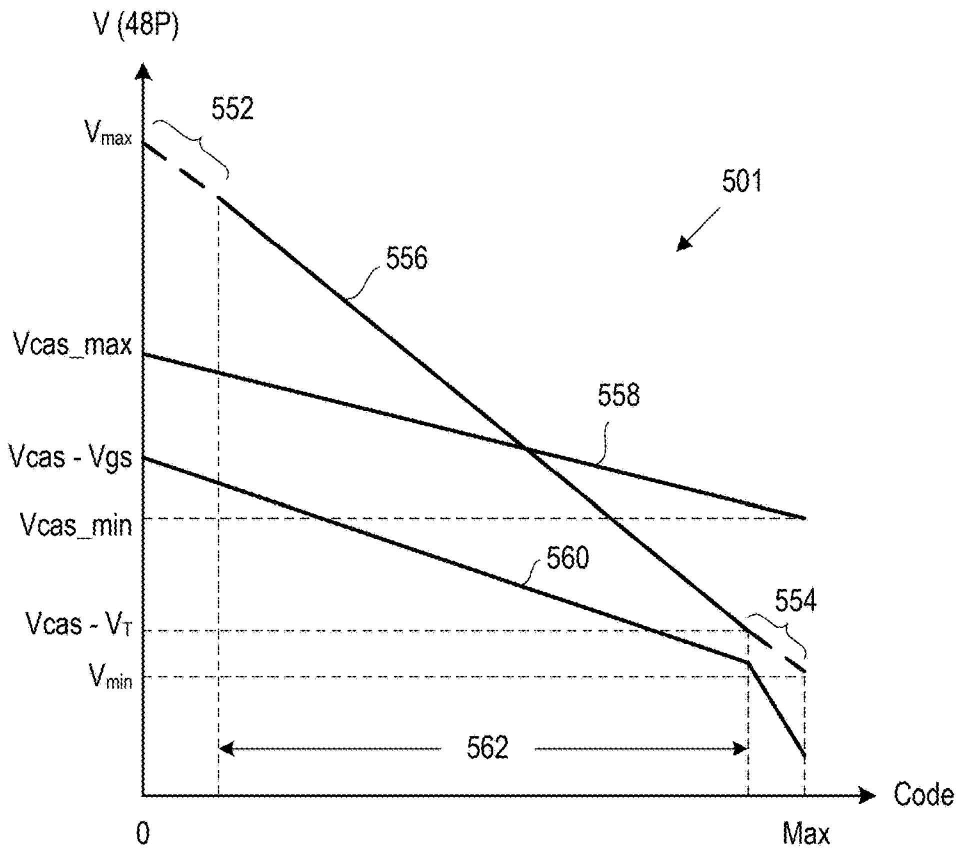
FIG. 5B depicts a graph relating voltages and DAC codes for the driver shown in FIGS. 3 and 4B according to some embodiments.

FIG. 5B depicts a graph 501 relating voltages and DAC codes for driver 25 shown in FIGS. 3 and 4B according to some embodiments. Graph 501 includes a horizontal axis representing DAC codes from minimum (0) to maximum. Graph 501 includes a vertical axis representing voltage at node 48P. A curve 556 can represent the NMOS cascode drain voltage (e.g., voltage at node 48P). A curve 558 can represent the NMOS cascode gate voltage. A curve 560 can represent the NMOS cascode source voltage (e.g., voltage at the source of NMOS transistor 310).

As shown by curve 556, the NMOS cascode drain voltage decreases from a $V_{max}$ value to a $V_{min}$ value as the DAC code increases from the minimum DAC code to the maximum DAC code. A region 552 of curve 556 near $V_{max}$ and minimum DAC code exhibits a higher cascode $V_{DS}$. A region 554 of curve 556 near $V_{min}$ and maximum DAC code corresponds to when the NMOS cascode enters the triode region from the saturation region. Region 554 can start when the voltage at node 48P reaches Vcas−$V_T$, where $V_T$ is the transistor threshold voltage and Vcas is the cascode transistor gate voltage. A region 562 between the end of region 552 and the beginning of region 554 represents a reliable and linear region of operation. When compared with region 512 in FIG. 5A, region 562 is wider, resulting in improved linearity at the minimum and maximum DAC codes.

Curve 558 shows that the NMOS cascode gate voltage falls with increasing DAC code from Vcas_max to Vcas_min, which is the range of bias voltage supplied by adaptive bias circuit 36. Curve 560 shows that the NMOS cascode source voltage falls from Vcas−$V_{GS}$ (gate to source voltage) towards $V_{min}$ as the DAC code increases towards maximum. At some DAC code, the NMOS cascode source voltage falls more steeply below $V_{min}$ within region 554 corresponding to the NMOS cascode transistor entering the triode region. Region 554, however, is less wide than region 504 shown in FIG. 5A. Further, since the source tracks the gate (due to the source-follower operation), which in turn tracks the drain (due to the adaptive bias), $V_{DS}$ (drain-source voltage) variation can be reduced, effectively widening region 562.

Figure 7:
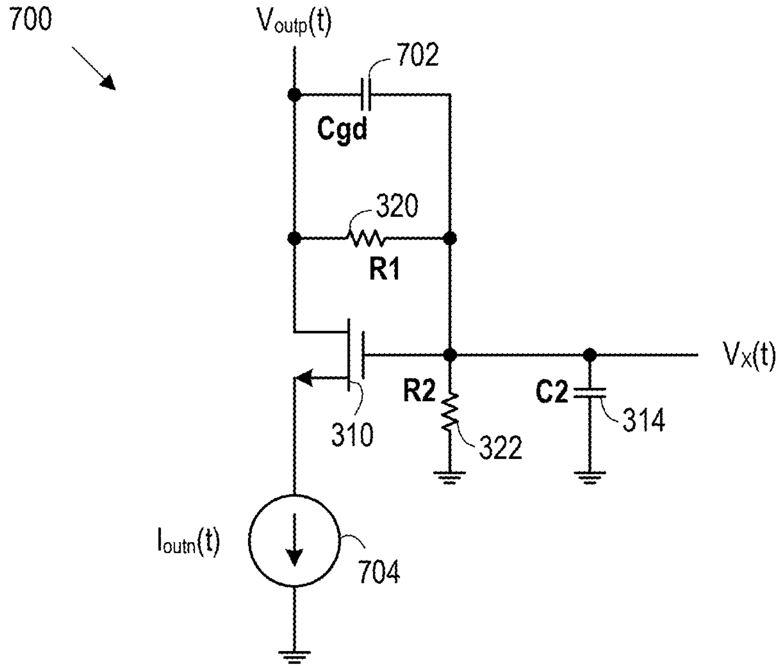
FIG. 7 is a schematic diagram a small-signal model of a driver at a cascode transistor according to some embodiments.

FIG. 7 is a schematic diagram a small-signal model of a driver at a cascode transistor according to some embodiments. In the example, NMOS transistor 310 is shown along with resistor 322, capacitor 314, and resistor 320. NMOS transistor 310 conducts the current signal $I_{outn}(t)$ as shown in FIG. 3, which is shown by a current source 704. NMOS transistor 310 includes a parasitic capacitance between gate and drain shown as capacitor 702 having a value of Cgd. The cascode gate transfer function can be expressed as:

$$\frac{V_X}{V_{outp}} = \left(\frac{R2}{R1 + R2}\right)\left(\frac{1 + sC_{gd}R1}{1 + s(R1\|R2)(C_{gd} + C2)}\right)$$

where s denotes a complex frequency variable. Capacitor 702, which represents the gate-drain capacitance of NMOS transistor 310, results in a zero in the cascode gate transfer function. At high frequencies, the gain at the gate of the cascode is Cgd/(Cgd+C2). Capacitor 314 can help control the bandwidth at the cascode gate. If R2/(R1+R2) is less than Cgd/(Cgd+C2), then the response at the gate is high-pass. This can help trade switch reliability for improved cascode reliability. If R2/(R1+R2) is greater than Cgd/(Cgd+C2), the response at the gate is low-pass. This trades cascode reliability for improved switch reliability. If R2/(R1+R2) is approximately equal to Cgd/(Cgd+C2), then the response at the gate is all-pass. Depending on the switch/cascode transistor types and bias voltages, the adaptive bias frequency response can be selected to be high-pass, low-pass, or all-pass to equalize the stress and reliability of the cascode and switch transistors.

Figure 8:
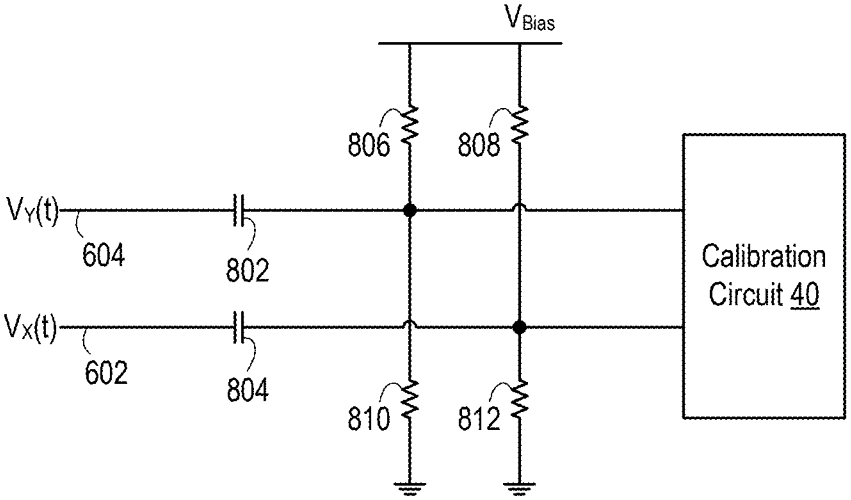
FIG. 8 is a schematic diagram depicting a connection between calibration circuit and a driver according to some embodiments.

FIG. 8 is a schematic diagram depicting a connection between calibration circuit and driver 25 according to some embodiments. Calibration circuit 40 can include a first input coupled to node 604 to receive the voltage $V_Y(t)$ through a capacitor 802 (e.g., an AC-coupling capacitor). Calibration circuit 40 can include a second input coupled to node 602 to receive the voltage $V_X(t)$ through a capacitor 804 (e.g., an AC-coupling capacitor). A bias circuit comprising resistors 806, 808, 810, and 812 can bias the first and second inputs of calibration circuit 40. Resistor 806 can be coupled between the first input and a voltage supply Vbias. Resistor 810 can be coupled between the first input and electrical ground. Resistor 808 can be coupled between the second input and the voltage supply Vbias. Resistor 812 can be coupled between the second input and electrical ground. The voltage divider formed by resistor 806 and 810 can bias the first input, and the voltage divider formed by resistor 808 and 812 can bias the second input.

During EOJ calibration, the output voltage Vdpp of driver 25 can be level-shifted and attenuated for reliability of calibration circuit 40. This can be achieved by using the voltage signals at the gates of the NMOS cascodes, e.g., transistor 310 and transistor 312. The attenuation can be by a factor of R2/(R1+R2). Additionally, the voltage signals can be level-shifted using AC-coupling capacitors and bias resistor ladders as shown in the example. Using the voltage signals at the NMOS cascode gates can also minimize parasitic loading of output 48 at driver 25, ensuring high output bandwidth.

FIG. 9 is a block diagram depicting transmitter 12 according to other embodiments. Elements of FIG. 9 that are the same or similar to those of FIG. 2 are designated with identical reference numerals. In embodiments, driver 25 can be implemented as a current-mode logic (CML) circuit. Driver 25 can include NMOS current DAC 28, NMOS cascode circuit 32, and adaptive bias circuit 36. PMOS current DAC 26, PMOS cascode circuit 30, and adaptive bias circuit 34 are omitted from the CML design. An output impedance 52 is coupled to output 48.

FIG. 10 is a schematic diagram depicting driver 25 according to the other embodiments of FIG. 9. NMOS current DAC 28 can be constructed and function as described above. NMOS cascode circuit 32 comprising NMOS transistors 310 and 312 can be arranged and function as described above. Adaptive bias circuit 36 can be constructed and function as described above. Output impedance 52 includes a resistor 1002, an inductor 1004, a resistor 1006, and an inductor 1008. Resistor 1002 can be coupled in series between inductor 1004 and the voltage supply $V_{IO}$. Inductor 1004 can be coupled in series between resistor 1002 and output terminal 48P. Resistor 1006 can be coupled in series between inductor 1008 and the voltage supply $V_{IO}$. Inductor 1008 can be coupled in series between resistor 1006 and terminal 48N. A current source 1010 can be coupled between the voltage supply $V_{IO}$ and terminal 48P. Current source 1010 can supply a current to terminal 48P. A current source 1012 can be coupled between the voltage supply $V_{IO}$ and terminal 48N. Current source 1012 can supply a current to terminal 48N. Current sources 1010 and 1012 can be common-mode lifter current sources. Driver 25 shown in FIG. 10 can have the same advantages as driver 25 shown in FIG. 3, including shared cascode transistors and the adaptive bias circuit for the cascode transistors. Calibration circuit 40 can also be coupled as described above in FIG. 8.

Figure 11:
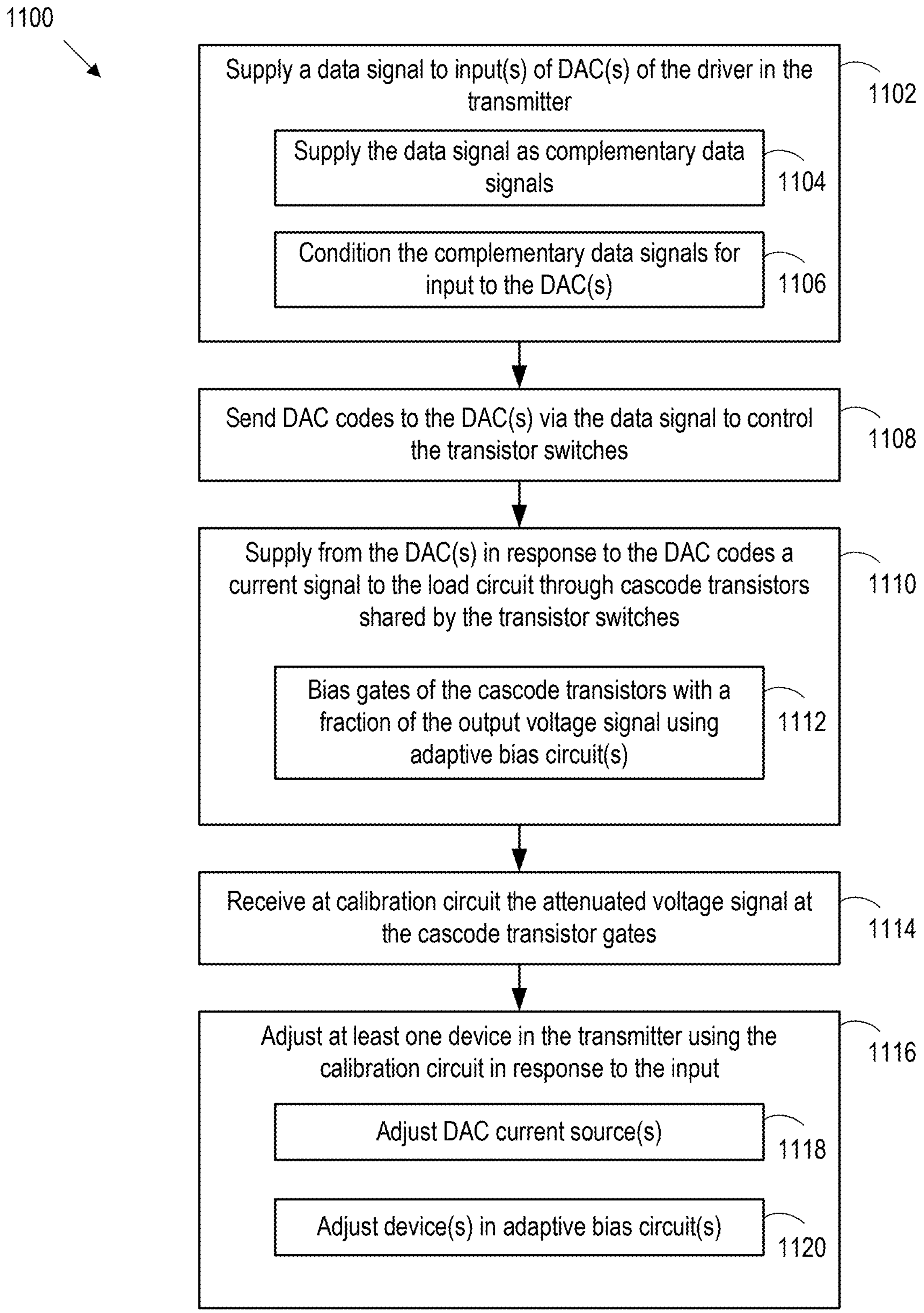
FIG. 11 is a flow diagram depicting a method of transmitting a signal to a load circuit according to some embodiments.

FIG. 11 is a flow diagram depicting a method 1100 of transmitting a signal to a load circuit according to some embodiments. Method 1100 begins at step 1102, where transmitter 12 supplies a data signal to input(s) of DAC(s) of driver 25. In an embodiment, driver 25 may include both NMOS current DAC 28 and PMOS current DAC 26 (e.g., FIGS. 2-3). In another embodiment, driver 25 may include only NMOS current DAC 28 (e.g., FIGS. 9-10). At step 1104, transmitter 12 can supply the data signal as complementary data signals (e.g., DATA_P and DATA_N). At step 1106, transmitter 12 can condition the complementary data signals for input to the DAC(s) (e.g., $DATA\_P_{NMOS}$, $DATA\_N_{NMOS}$, $DATA\_P_{PMOS}$, $DATA\_N_{PMOS}$).

At step 1108, transmitter 12 can send DAC codes to the DAC(s) via the data signal to control transistor switches in the DAC(s). At step 1110, the DAC(s) can supply a current signal to the load circuit in response to the DAC codes through cascode transistors shared by the transistor switches. At step 1112, adaptive bias circuit(s) can bias gates of the cascode transistors with a fraction of the output voltage signal. At step 1114, calibration circuit 40 can receive the attenuated volage signal at the cascode transistor gates as input. At step 1116, calibration circuit 40 can adjust at least one device in transmitter 12 in response to the input. For example, at step 1118, calibration circuit 40 can adjust current source(s) in DAC(s). At step 1120, calibration circuit 40 can adjust device(s) in the adaptive bias circuit(s). In some embodiments, calibration circuit can perform both 1118 and 1120. The devices in the adaptive bias circuit(s) that can be adjusted include at least one of resistor 322, resistor 324, current source 318, capacitor 314, capacitor 316, resistor 330, resistor 332, current source 336, capacitor 338, or capacitor 340.

As used herein, the phrase "at least one of" preceding a series of items, with the term "and" or "or" to separate any of the items, modifies the list as a whole rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

As used herein, the term "couple" and its derivatives include: (a) electrical and communicative coupling; and (b) do not imply a direct connection, but rather may include intervening elements, unless described as "directly coupled."

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The techniques herein have been described, at least in part, in terms of one or more embodiments. An embodiment is used herein to illustrate a technique or techniques, an aspect thereof, a feature thereof, a concept thereof, and/or an example thereof. A physical embodiment of an apparatus, an article of manufacture, a machine, and/or of a process that embodies the techniques may include one or more of the aspects, features, concepts, examples, etc. described with reference to one or more of the embodiments discussed herein. Although one or more embodiments have been described in some detail for clarity of understanding, certain changes may be made within the scope of the claims. Accordingly, the described embodiments are to be considered as illustrative and not restrictive, and the scope of the claims is not to be limited to details given herein but may be modified within the scope and equivalents of the claims. In the claims, elements and/or steps do not imply any particular order of operation unless explicitly stated in the claims.

Boundaries between components, operations, and data stores are somewhat arbitrary, and particular operations are illustrated in the context of specific illustrative configurations. Other allocations of functionality are envisioned and may fall within the scope of the invention. In general, structures and functionalities presented as separate components in exemplary configurations may be implemented as a combined structure or component. Similarly, structures and functionalities presented as a single component may be implemented as separate components. These and other variations, additions, and improvements may fall within the scope of the appended claims.

What is claimed is:

1. A transmitter, comprising:

an output comprising a first terminal and a second terminal;

a driver having first transistor switches, coupled to first current sources;

a first circuit having a first transistor coupled between the first transistor switches and the first terminal, and a second transistor coupled between the first transistor switches and the second terminal; and a second circuit, coupled between the output and gates of the first and second transistors, the second circuit including a first voltage divider, having an output coupled to a first capacitor, configured to bias the first transistor with a first fraction of a first voltage signal at the first terminal, and a second voltage divider, having an output coupled to a second capacitor, configured to bias the second transistor with a first fraction of a second voltage signal at the second terminal.

2. The transmitter of claim 1, wherein the driver includes second transistor switches coupled to second current sources, and wherein the transmitter comprises:

a third circuit having a third transistor coupled between the second transistor switches and the first terminal and a fourth transistor coupled between the second transistor switches and the second terminal; and a fourth circuit, coupled between the output and gates of the third and fourth transistors, configured to bias the third transistor with a second fraction of the first voltage signal and bias the fourth transistor with a second fraction of the second voltage signal.

3. The transmitter of claim 1, wherein the driver comprises a digital-to-analog converter (DAC) that includes the first transistor switches and the first current sources, wherein the first transistor switches comprise source-coupled transistor pairs, and wherein gates of the source-coupled transistor pairs comprise an input of the DAC and drains of the source-coupled transistor pairs comprise an output of the DAC.

4. The transmitter of claim 1, wherein the first voltage divider is configured to provide the first fraction of the first voltage signal to the gate of the first transistor and the second voltage divider is configured to provide the first fraction of the second voltage signal to the gate of the second transistor.

5. The transmitter of claim 4, wherein the first voltage divider comprises a first resistor coupled between the first terminal and the gate of the first transistor and a second resistor coupled between the gate of the first transistor and a first node, and wherein the second voltage divider comprises a third resistor coupled between the second terminal and the gate of the second transistor and a fourth resistor coupled between the gate of the second transistor and the first node.

6. The transmitter of claim 5, wherein the second circuit further comprises:

a current source coupled to the first node;

wherein the first capacitor is coupled to the gate of the first transistor; and wherein the second capacitor is coupled to the gate of the second transistor.

7. The transmitter of claim 1, further comprising:

a calibration circuit having an input coupled to the second circuit, the calibration circuit configured to calibrate at least one of the driver or the second circuit in response to the first fraction of the first voltage signal and the first fraction of the second voltage signal.

8. The transmitter of claim 7, further comprising:

a level shifter coupled between the calibration circuit and the second circuit.

9. An apparatus, comprising:

a load circuit coupled to a first node and a second node;

a driver having a digital-to-analog converter (DAC) coupled to the load circuit;

a first circuit having a first transistor coupled between slices of the DAC and the first node, and a second transistor coupled between the slices and the second node; and a second circuit, coupled to the first and second nodes and gates of the first and second transistors, the second circuit including a first voltage divider, having an output coupled to a first capacitor, configured to bias the first transistor with a first fraction of a first voltage signal from the first node, and a second voltage divider, having an output coupled to a second capacitor, configured to bias the second transistor with a first fraction of a second voltage signal from the second node.

10. The apparatus of claim 9, wherein the load circuit comprises:

an impedance coupled to the first node and the second node; and a device coupled to the impedance through a transmission line.

11. The apparatus of claim 10, wherein the device comprises a laser diode or modulator of a laser.

12. The apparatus of claim 9, wherein the slices of the DAC include transistor switches coupled to current sources, the apparatus further comprising:

an integrated circuit (IC) having the driver and the first circuit, the first transistor, the second transistor, and transistors of the transistor switches being core transistors for a technology node of the IC.

13. The apparatus of claim 9, wherein the DAC is a first DAC, a first output of the first DAC coupled to the first node through the first transistor, a second output of the first DAC coupled to the second node through the second transistor, and wherein the apparatus further comprises:

a second DAC;

a third circuit having a third transistor and a fourth transistor, a first output of the second DAC coupled to the first node through the third transistor, and a second output of the second DAC coupled to the second node through the fourth transistor; and an impedance of the load circuit coupled between the first and second nodes.

14. The apparatus of claim 13, further comprising:

a fourth circuit coupled to the first and second nodes and gates of the third and fourth transistors, configured to bias the third transistor with a second fraction of the first voltage signal and bias the second transistor with a second fraction of the second voltage signal.

15. The apparatus of claim 9, wherein the load circuit comprises a first impedance coupled between the first node and a voltage supply, and a second impedance coupled between the second node and the voltage supply.

16. The apparatus of claim 9, wherein:

the first voltage divider is configured to provide the first fraction of the first voltage signal to the gate of the first transistor;

the second voltage divider is configured to provide the first fraction of the second voltage signal to the gate of the second transistor;

the apparatus further comprises a current source coupled to a node between the first and second voltage dividers;

the first capacitor is coupled to the gate of the first transistor; and the second capacitor is coupled to the gate of the second transistor.

17. A method of transmitting a signal to a load circuit, comprising:

supplying a data signal to an input of a digital-to-analog converter (DAC) of a driver in a transmitter, the transmitter including an output having a first terminal and a second terminal each coupled to the load circuit;

sending, via the data signal, codes to the DAC to control transistor switches coupled to current sources, first outputs of the transistor switches coupled to the first terminal through a first transistor, second outputs of the transistor switches coupled to the second terminal through a second transistor; and biasing, using a first voltage divider having an output coupled to a first capacitor, a gate of the first transistor with a fraction of a first voltage signal at the first terminal; and biasing, using a second voltage divider having an output coupled to a second capacitor, a gate of the second transistor with a fraction of a second voltage signal at the second terminal.

18. The method of claim 17, further comprising:

supplying, from the DAC in response to the codes, a current signal to the load circuit through the first and second transistors.

19. The method of claim 17, further comprising:

receiving, at an input of a calibration circuit, the fraction of the first voltage signal and the fraction of the second voltage signal.

20. The method of claim 19, further comprising:

adjusting, by the calibration circuit in response to the input thereof, at least one device in the transmitter.

* * * * *